United States Patent [19]

Yoshimizu et al.

[11] Patent Number: 5,442,224
[45] Date of Patent: Aug. 15, 1995

[54] TWO-TERMINAL MIM DEVICE HAVING STABLE NON-LINEARITY CHARACTERISTICS AND A LOWER ELECTRODE OF THIN TA FILM DOPED WITH NITROGEN

[75] Inventors: Toshiyuki Yoshimizu, Ikoma; Masahiro Kishida, Nabari; Toshiaki Fukuyama, Nara; Yoshihisa Ishimoto, Sakai; Takeshi Seike, Kitakatsuragi; Masakazu Matoba, Tenri, all of Japan

[73] Assignee: Sharp Kabushiki Kaisha, Osaka, Japan

[21] Appl. No.: 188,818

[22] Filed: Jan. 31, 1994

[30] Foreign Application Priority Data

Feb. 3, 1993 [JP] Japan .................................. 5-016569
Mar. 8, 1993 [JP] Japan .................................. 5-046959
May 31, 1993 [JP] Japan .................................. 5-129775
Aug. 11, 1993 [JP] Japan .................................. 5-199790

[51] Int. Cl.$^6$ ............................................. G02F 1/13
[52] U.S. Cl. .................................. 257/536; 257/537; 359/58
[58] Field of Search ............... 257/59, 72, 536, 537, 257/761; 359/58, 87; 437/195; 430/20, 311

[56] References Cited

U.S. PATENT DOCUMENTS

| | | | |
|---|---|---|---|
| 4,413,883 | 11/1983 | Baraff et al. | 359/58 |
| 4,683,183 | 7/1987 | Ono | 359/58 |
| 5,274,485 | 12/1993 | Narita et al. | 359/58 |

FOREIGN PATENT DOCUMENTS

| | | | |
|---|---|---|---|
| 46-17267 | 5/1971 | Japan | 359/58 |
| 61-32673 | 7/1986 | Japan | 359/58 |
| 61-32674 | 7/1986 | Japan | 359/58 |
| 1-281437 | 11/1989 | Japan | 359/58 |
| 2-257123 | 10/1990 | Japan | 359/58 |
| 2-298921 | 12/1990 | Japan | 359/58 |
| 3-73932 | 3/1991 | Japan | 359/58 |

*Primary Examiner*—William Mintel
*Assistant Examiner*—Minhloan Tran
*Attorney, Agent, or Firm*—Nixon & Vanderhye

[57] ABSTRACT

A two-terminal nonlinear device according to the present invention includes a lower electrode of a thin Ta film doped with nitrogen which is formed on a substrate, an anodized oxide film formed by anodizing a surface of the lower electrode, and an upper electrode of a metal thin film which is formed on the anodized oxide film, wherein the thin Ta film includes a structure in which first portions and second portions are alternately deposited, the first portions containing a different amount of nitrogen from that contained in the second portions.

12 Claims, 32 Drawing Sheets

CONTENT OF NITROGEN IN TARGET  N = 3%

FLOW RATE RATIO OF N₂ GAS   N₂= 2%

CONTENT OF NITROGEN IN TARGET  N = 5%

FLOW RATE RATIO OF N₂ GAS   N₂= 0%

CONTENT OF NITROGEN IN TARGET  N = 0%

FLOW RATE RATIO OF N₂ GAS   N₂= 2.9%

CONTENT OF NITROGEN IN TARGET  N = 0%

FLOW RATE RATIO OF N₂ GAS   N₂= 4.3%

- ● - - Difference from Average Value  ~ -20%
- ◎ - - Difference from Average Value - 20%  ~ 20%
- ▲ - - Difference from Average Value  20% ~

$t_1$ : FORMATION OF UPPER ELECTRODE $t_2$ : FORMATION OF PIXEL ELECTRODE $t_3$ : FORMATION OF ORIENTATION FILM $t_4$ : COMPLETION OF LIQUID CRYSTAL CELL

TWO-TERMINAL MIM DEVICE HAVING STABLE NON-LINEARITY CHARACTERISTICS AND A LOWER ELECTRODE OF THIN TA FILM DOPED WITH NITROGEN

BACKGROUND OF THE INVENTION

1. Field of the Invention

The present invention relates to a two-terminal nonlinear device. Such a device may be used, for instance, in a liquid crystal display apparatus, as a switching element.

2. Description of the Related Art

In recent years, liquid crystal display apparatuses have been widely used in various fields, such as an audio visual (AV) field and an office automation (OA) field. In particular, products of the low end are equipped with twisted nematic (TN), or super twisted nematic (STN) passive type liquid crystal display apparatuses, and products of high quality are equipped with active matrix type liquid crystal display apparatuses using thin film transistors (TFTs) which are three-terminal nonlinear devices.

The active matrix liquid crystal display apparatus is superior to a cathode ray tube (CRT) for its characteristics of color reproducibility, saving space, light weight, and low power. Due to such characteristics, applications thereof have been rapidly developed. However, in the case of using the TFTs as switching elements, from 6 to 8 times or more fabrication processes of a thin film and a photolithography process are required for forming the TFTs, thus increasing the manufacturing costs. On the other hand, the liquid crystal display apparatus using two-terminal nonlinear devices as the switching elements is superior to the liquid crystal display apparatus using the TFTs for its savings in cost, and superior to a liquid crystal display apparatus of a passive type for its display quality. Thus, the liquid crystal display apparatus using the two-terminal nonlinear devices has been rapidly developed.

As the above-mentioned two-terminal nonlinear device, two-terminal nonlinear devices of a Schottky diode type, a varistor type, and an MIM (metal-insulator-metal) type have conventionally been known. In recent years, two-terminal nonlinear devices of a D²R (double diode plus reset) type and an organic ferroelectric thin film type have been widely studied. However, only the MIM and D²R two-terminal nonlinear devices are in practical use. The MIM two-terminal nonlinear device (hereinafter, referred to as "the MIM device") includes upper and lower electrodes interposing an insulator therebetween. For example, the MIM device disclosed in Japanese Patent Publication Nos. 61-32673 and 61-32674, and U.S. Pat. No. 4,413,883 is explained. The lower electrode is formed of a thin Ta film on a substrate or a base coating film formed thereon. The insulator is formed by the anodization of the surface of the lower electrode. In this case, the insulator is a $Ta_2O_5$ layer. The upper electrode of one of Ta, Cr, Ti and Al is formed thereon. The MIM device can be produced using less than one third of processes required for fabricating the TFT. Therefore, the MIM devices are mainly used in the liquid crystal display apparatus using the two-terminal nonlinear devices.

The liquid crystal display apparatus using the MIM devices includes an active matrix substrate on which the MIM devices and pixel electrodes are formed and a counter substrate on which the wiring of an ITO transparent conductive film or the like, is formed in a stripe shape so as to cross the wiring provided on the active matrix substrate at right angles. The two substrates are attached to each other by pressure and heat, thereby fabricating a liquid crystal cell.

The liquid crystal cell is fabricated as follows:

First, an orientation film formed of polyimide type organic polymer is coated onto each of the active matrix substrate and the counter substrate, then subjected to a rubbing treatment so as to align liquid crystal molecules. Successively, a sealing agent is coated onto one substrate and a spacer is dispersed on the other substrate. The two substrates in this state are attached to each other and pressed by heat. After that, liquid crystal is injected between the substrates and the resulting substrates are sealed. In this way, the liquid crystal cell is fabricated.

In order to realize a display with high quality, it is required that the MIM device has a symmetrical curve of a current-voltage characteristic while a positive voltage and a negative voltage are applied to the lower electrode. Further, the MIM device capacity should be smaller than the liquid crystal capacity. The asymmetrical curve of the current-voltage characteristic causes the occurrence of a residual image on the display. There is a problem regarding crosstalk, in the case where the MIM device capacity is not small enough with respect to the liquid crystal capacity.

In order to prevent the residual image and the crosstalk, various techniques have been studied. For example, an insulator is usually formed by anodizing a lower electrode. As described in Japanese Patent Publication No. 46-17267, anodization is a conventionally established method. An insulator having high through-put and superior productivity can be obtained by the anodization. Further, a technique in which the resistance of wiring is reduced in order to obtain a display apparatus of a larger size and high quality has been studied. For example, a thin Ta film used for the wiring is doped with nitrogen so as to reduce the specific resistance.

However, while forming the liquid crystal cell, the active matrix substrate and the counter substrate are pressed and attached to each other by a heat treatment of relatively high temperature (approximately in the range of 150° to 200° C.). As shown in FIG. 34, the nonlinearity of the MIM device is gradually reduced, as the time for the heat treatment increases. The deterioration of the nonlinearity of the MIM device can be remarkably observed, particularly in the case where a thin film of Ta having a β structure (hereinafter, referred to as "a β-Ta film") is used as a lower electrode.

The β-Ta film has conventionally been used in various fields. The β-Ta film is deposited by sputtering in an atmosphere of Ar (argon) gas using a pure Ta target with purity of 99.99%. Namely, the β-Ta film is deposited by a reactive sputtering method using a piece of target. In the case of using the β-Ta film as the lower electrode of the MIM device, immediately after the MIM device is formed, the nonlinearity of the MIM device is satisfactory; however, since the active matrix substrate where the MIM device is formed is thermally treated as described above, after the formation of the MIM device, the nonlinearity thereof is remarkably deteriorated. Accordingly, the temperature for the heat treatment should be decreased. However, the active matrix substrate and the counter substrate are not satisfactorily attached to each other by heat and pressure under low temperature, thus reducing reliability of the liquid crystal display apparatus.

On the contrary, the specific resistance of the thin Ta film is conventionally reduced by doping nitrogen into the Ta thin film, which can prevent the deterioration of the nonlinearity of the MIM device. Inventors of the present invention fabricated the MIM device having a thin Ta film doped with nitrogen which was deposited by the reactive sputtering method using a piece of target in an atmosphere of (Ar+$N_2$) gas, and examined the nonlinearity of the MIM device. FIG. 35 shows the change of the nonlinearity of the MIM device, in the case where the thin Ta film doped with nitrogen is deposited with various kinds of the flow rate ratio of $N_2$ gas.

It is understood from FIG. 35 that as the density of nitrogen gas becomes smaller (i.e., the amount of nitrogen in the thin Ta film becomes smaller), the nonlinearity of the MIM device becomes generally smaller. In contrast, when the density of nitrogen gas is large (i.e., the amount of nitrogen is large), the deterioration of the nonlinearity of the MIM device can be prevented. However, in the case of a high flow rate ratio of $N_2$ gas, there is a problem in that the nonlinearity of the MIM device is not uniform and therefore unstable at high temperature.

As one of factors making unstable the nonlinearity of the MIM device, the uneven thickness of the insulator is considered.

The uneven thickness of the insulator is caused as follows:

For example, in a reactive sputtering method in an atmosphere of (Ar+$N_2$) gas, nitrogen in $N_2$ gas is taken in the thin Ta film which is deposited. Thus, it is important that $N_2$ gas is uniformly introduced into a sputtering chamber. However, the inventors' studies show that when the flow rate ratio of $N_2$ gas to Ar gas is more than approximately 4%, the number of nitrogen atoms taken in the Ta film is not uniform, making it extremely difficult to uniformly regulate the number of the nitrogen atoms in the thin Ta film. Due to this, the thickness of the insulator formed by anodizing the Ta film doped with nitrogen is not uniform.

Table 1 shows the relationships of the flow ratio of $N_2$ gas in an atmosphere of (Ar+$N_2$) gas, the nonlinearity of the MIM device using a thin Ta film and the resistance value of the thin Ta film, in the case of forming the thin Ta film doped with nitrogen by reactive sputtering. As is understood from Table 1, when the flow rate ratio of $N_2$ gas is more than approximately 4%, the amount of nitrogen in the thin Ta film is not uniform, so that the resistance value is not uniform. In this case, when the thin Ta film is anodized, an insulator having an uneven thickness will be formed, because the resistance value of the thin Ta film is not uniform.

TABLE 1

| Flow Rate Ratio of $N_2$ gas to (Ar + $N_2$) gas | MIM Device Characteristics (Nonlinearity) | Uniformity (Resistance) | Note |
| --- | --- | --- | --- |
| 2.2% | | | |
| 2.9% | | * | *FIG. 7 |
| 3.1% | | | |
| 3.6% | | | |
| 4.3% | | * | *FIG. 7 |

[ -- Very good
  -- Good
  -- Poor ]

In a liquid crystal display apparatus using the MIM devices, the amount of nitrogen in the thin Ta film contributes to the characteristics of the MIM device, particularly to thermal stability of the nonlinearity thereof. Moreover, as shown in FIG. 36, the amount of nitrogen in the thin Ta film helps to improve the temperature dependence of the contrast. A liquid crystal display apparatus using a thin Ta film formed under the condition that the flow rate ratio of $N_2$ gas is 2.9 vol % (a broken line) has a varied contrast smaller than that of a liquid crystal display device using a Ta film formed under the condition that the flow rate ratio of $N_2$ gas is 4.3 vol % (a dash-dot line). However, as the amount of doped nitrogen is increased, the amount of nitrogen contained in the thin Ta film becomes smaller.

SUMMARY OF THE INVENTION

A two-terminal nonlinear device according to the present invention includes a lower electrode of a thin Ta film doped with nitrogen which is formed on a substrate, an anodized oxide film formed by anodizing a surface of the lower electrode, and an upper electrode of a metal thin film which is formed on the anodized oxide film, wherein the thin Ta film includes a structure in which first portions and second portions are alternately deposited, the first portions containing a different amount of nitrogen from that contained in the second portions.

In one embodiment of the invention, the first portions and the second portions are alternately deposited in a thickness direction of the thin Ta film.

In another embodiment of the invention, the ratio of a peak value of a profile of the intensity of $^{14}N^+$ emission with regard to the intensity of $^{181}Ta^+$ emission in the first portions to that in the second portions is substantially in the range of 1:1.54 to 1:1.71.

In still another embodiment of the invention, the ratio of intensity of X-ray diffraction of (110) to the intensity of X-ray diffraction of (002) of the thin Ta film is substantially 1:0.248.

In still another embodiment, the thin Ta film is formed by a reactive sputtering using two or more pieces of Ta target with a purity of 99.99% in a mixed gas of argon gas and nitrogen gas; the ratio of a flow rate of the nitrogen gas to a flow rate of the mixed gas is substantially 3% to 7%; and the two or more pieces of Ta target are aligned in series in a direction where the substrate is conveyed.

In still another embodiment, a specific resistance of the thin Ta film is substantially in a range of 90 $\mu\Omega$cm to 165 $\mu\Omega$cm.

In still another embodiment, the specific resistance of the thin Ta film is substantially in a range of 105 $\mu\Omega$cm to 150 $\mu\Omega$cm.

In still another embodiment, the thin Ta film is formed by sputtering using two or more pieces of sintered TaN target in a mixed gas of argon gas and nitrogen gas; the ratio of a flow rate of the nitrogen gas to a flow rate of the mixed gas is substantially 4% or less; and the two or more pieces of sintered TaN target are aligned in series in a direction where the substrate is conveyed.

In still another embodiment of the invention, each of the two or more pieces of sintered TaN target contains nitrogen in amount of 5 mol % or less.

In still another embodiment of the invention, the thin Ta film is formed with a sputtering power of 4 W/cm$^2$ for a unit area of the sintered TaN target.

In still another embodiment of the invention, a specific resistance of the thin Ta film is substantially in a range of 80 μΩcm to 165 μΩcm.

In still another embodiment of the invention, the specific resistance of the thin Ta film is substantially in a range of 95 μΩcm to 150 μΩcm.

A two-terminal nonlinear device according to the present invention includes a lower electrode of a thin Ta film doped with nitrogen which is formed on a substrate, an anodized oxide film formed by anodizing a surface of the lower electrode, and an upper electrode of a metal thin film formed on the anodized oxide film, wherein the thin Ta film doped with nitrogen is formed by sputtering using sintered TaN target containing nitrogen in amount of 4 mol % to 7 mol %.

In one embodiment of the invention, the thin Ta film doped with nitrogen is formed by a DC sputtering at a predetermined sputtering power so that a resistance coefficient lnA represented by a Poole-Frenkel current flowing between the lower electrode and the upper electrode is substantially in the range of −32 to −28.

In another embodiment of the invention, the thin Ta film doped with nitrogen is formed under the conditions that a sputtering power, a temperature and the time for heating the substrate, a conveyance rate of the substrate, a distance between the substrate and the sintered TaN target, and a sputtering gas pressure are in the range of 2.2 kW to 3.2 kW, 100° C., 180 seconds, 100 mm/min, 77 mm, and 0.40 Pa, respectively.

In still another embodiment of the invention, a specific resistance of the thin Ta film is substantially in a range of 70 μΩcm to 165 μΩcm.

In still another embodiment of the invention, the specific resistance of the thin Ta film is substantially in a range of 85 μΩcm to 150 μΩcm.

A method for fabricating a two-terminal nonlinear device having a lower electrode, an insulator and an upper electrode, according to the present invention, includes the steps of: forming the lower electrode on a substrate, forming an anodized oxide film by anodizing the lower electrode, and forming the upper electrode on the anodized oxide film, the step for forming the lower electrode including the steps of: depositing a thin Ta film doped with nitrogen by a reactive sputtering using two or more pieces of target of Ta in a mixed gas of argon gas and nitrogen gas, while conveying the substrate in a desired direction, the two or more pieces of Ta target being aligned in series in a direction where the substrate is conveyed, and patterning the thin Ta film into a desired shape to form the lower electrode.

In one embodiment of the invention, the target of Ta is pure Ta target with a purity of 99.99% and the ratio of a flow rate of nitrogen gas to a flow rate of the mixed gas is substantially in the range of 3% to 7%.

In another embodiment of the invention, the target of Ta is a sintered TaN target and the ratio of a flow rate of nitrogen gas to a flow rate of the mixed gas is substantially 4% or less.

In still another embodiment of the invention, the amount of nitrogen contained in the sintered TaN target is 5 mol % or less.

In still another embodiment of the invention, the thin Ta film is deposited at a sputtering power of 4 W/cm² for a unit area of the sintered TaN target.

In still another embodiment of the invention, the thin Ta film is deposited by using an in-line sputtering apparatus.

In still another embodiment of the invention, the thin Ta film is deposited by using a rotatory sputtering apparatus.

In still another embodiment of the invention, the step for forming the anodized oxide film is conducted in a solution containing an ammonium group.

A method for fabricating a two-terminal nonlinear device having a lower electrode, an insulator, and an upper electrode, according to the present invention, includes the steps of: forming a lower electrode on a substrate, forming an anodized oxide film by anodizing the lower electrode, and forming the upper electrode on the anodized oxide film, the step for forming the lower electrode including the steps of: depositing a thin Ta film doped with nitrogen on the substrate by sputtering using sintered TaN target containing nitrogen in amount of substantially in the range of 4 mol % to 7 mol %, while conveying the substrate, and patterning the thin Ta film into a desired shape to form the lower electrode.

In one embodiment of the invention, the step for forming the thin Ta film is conducted by a DC sputtering at such a sputtering power that a resistance coefficient lnA represented by a Poole-Frenkel current flowing between the upper electrode and the lower electrode is substantially in the range of −32 to −28.

In another embodiment of the invention, the step for forming the thin Ta film is conducted under the condition that a sputtering power, a temperature and the time for heating the substrate, a conveyance rate of the substrate, a distance between the substrate and the sintered TaN target, and a sputtering gas pressure are in the range of 2.2 kW to 3.2 kW, 100° C., 180 seconds, 100 mm/min, 77 mm, and 0.40 Pa, respectively.

Thus, the invention described herein makes possible the advantages of (1) providing two-terminal nonlinear devices of an MIM type having an uniform and thermally stable nonlinearity, and (2) providing a liquid crystal display apparatus using the MIM devices as switching elements in which a residual image does not occur on a display.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying drawings.

Example 1

Figure 1:
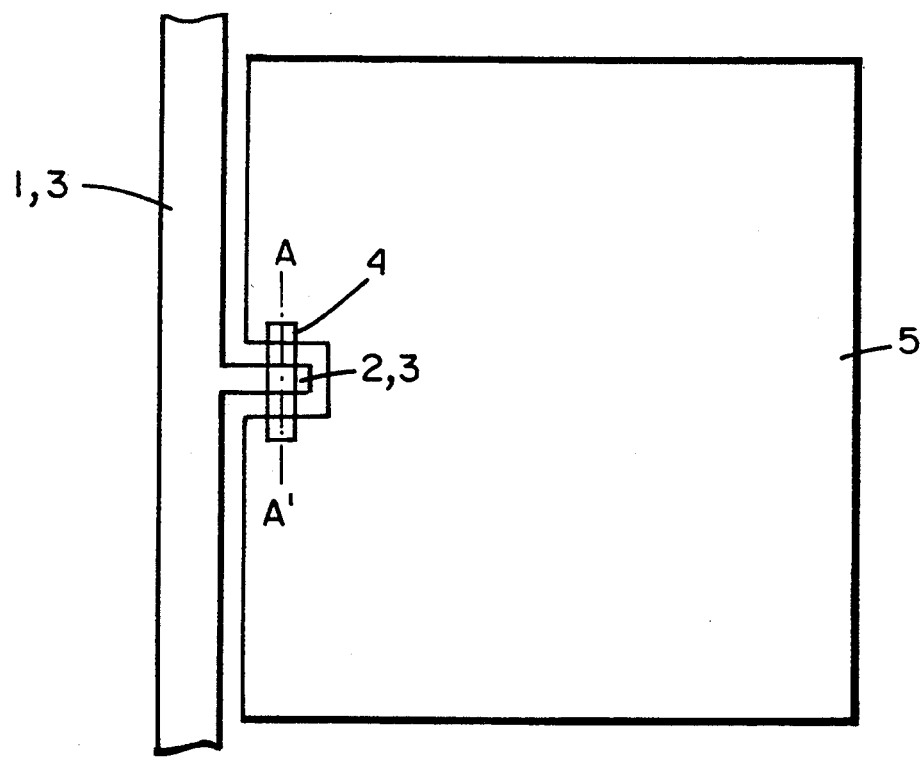
FIG. 1 is a plan view showing an active matrix substrate on which two-terminal nonlinear devices of an MIM type (hereinafter, referred to as "MIM devices") of Example 1 of the present invention are formed as switching elements.
Figure 2:
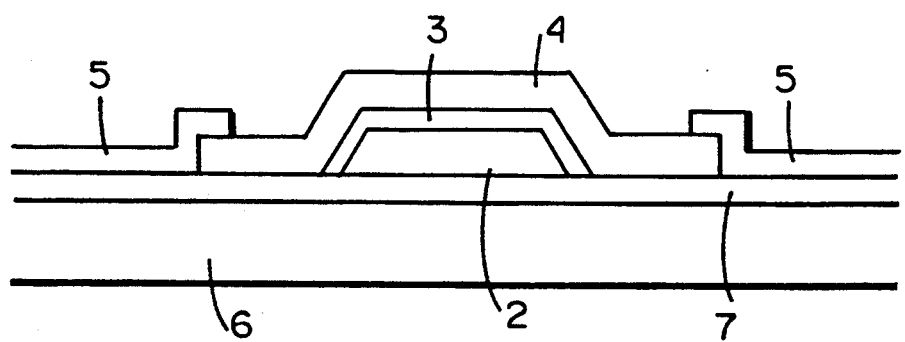
FIG. 2 is a cross-sectional view taken along a line A—A' of FIG. 1.

FIG. 1 shows a plan view of an active matrix substrate on which two-terminal nonlinear devices of an MIM type (hereinafter, referred to as "MIM devices") as a first example of the present invention. FIG. 2 shows a cross-sectional view taken along a line A—A' in FIG. 1. In this example, the MIM devices are used as switching elements of the liquid crystal display apparatus. In addition, FIG. 1 shows the active matrix substrate for 1 pixel.

The structure of the active matrix substrate will be described with reference to FIG. 2. The active matrix substrate comprises a substrate 6 formed of glass or the like. A base coating insulator 7 is provided on the glass substrate 6 and a plurality of signal lines 1 (as shown in FIG. 1) formed of a thin Ta film are provided thereon in parallel. Further, lower electrodes 2 branched from the signal lines 1 are formed on the base coating insulator 7. Insulators 3 are formed on the signal lines 1 and the lower electrodes 2 by anodizing surfaces of the signal lines 1 and lower electrodes 2. Upper electrodes 4 formed of a Ta, Cr, Ti, Al film or the like are formed on the insulators 3. The MIM device comprises one lower electrode 2, one upper electrode 4 and one insulator 3 sandwiched therebetween. The upper electrode 4 is electrically connected to a corresponding one of the pixel electrodes 5 formed of an ITO transparent conductive film or the like. Further, the thin Ta film used for the signal line 1 and lower electrode 2 has a structure in which portions having a small amount of nitrogen (hereinafter, referred to as "poor portions") and portions having a large amount of nitrogen (hereinafter, referred to as "rich portions") are alternately deposited in the thickness direction of the thin Ta film.

The active matrix substrate shown in FIGS. 1 and 2 is fabricated as follows, under the condition that a liquid crystal cell has a reflective monochrome TN liquid crystal mode having 160×160 dots and 0.25 mm pitch; the width of each signal line 1 is 30 μm; the size of the MIM device is 5 μm×5 μm; and the ratio of the MIM capacity to the liquid crystal capacity is approximately 1:10.

First, the base coating insulator 7 of $Ta_2O_5$ or the like is formed on the glass substrate 6 by sputtering or the like so as to have a thickness of 5000 angstroms. No-alkali glass, borosilicate glass and soda glass may be used for the glass substrate 6. In this example, #7059 Fusion Pilex Glass (manufactured by Corning Japan Co., Ltd.) is used for the glass substrate 6. The base coating insulator 7 can be omitted; however, thin films formed on the base coating insulator 7 can be prevented from being contaminated by the substrate 6, whereby further excellent characteristics of the MIM device can be obtained.

Successively, the thin Ta film is deposited on the glass substrate 6 by a reactive sputtering so as to have a thickness of 3000 angstroms. In the reactive sputtering, three pieces of target of Ta with a purity of 99.99% are aligned in series in the direction where the glass substrate 6 is conveyed. Moreover, argon (Ar) gas and nitrogen ($N_2$) gas are used as the reactive gas. The amount of nitrogen contained in the deposited thin Ta film can be varied depending on the flow rate ratio of $N_2$ gas to $(Ar+N_2)$ gas. In this example, the flow rate ratio of $N_2$ gas to $(Ar+N_2)$ gas is adjusted so that the flow rate ratio is set at 2.2%, 2.9%, 3.6%, 4.1%, 4.3%, 5.7% and 8.3% for sputtering. Further, the thicknesses of the poor and rich portions can be changed by appropriately adjusting intervals between the pieces of Ta target and conditions such as the sputtering power and the conveyance rate of the glass substrate 6. In this example, sputtering is conducted under the conditions that each piece of target has a size of 5 inches×16 inches; each interval between the pieces of target is 10 cm; the sputtering power is 4.5 kW (current: 8.5 A, voltage: 530 V), the conveyance rate of the substrate is 460 mm/min; the temperature is 100° C.; and the sputtering rate is 200 nm/min.

Figure 3:
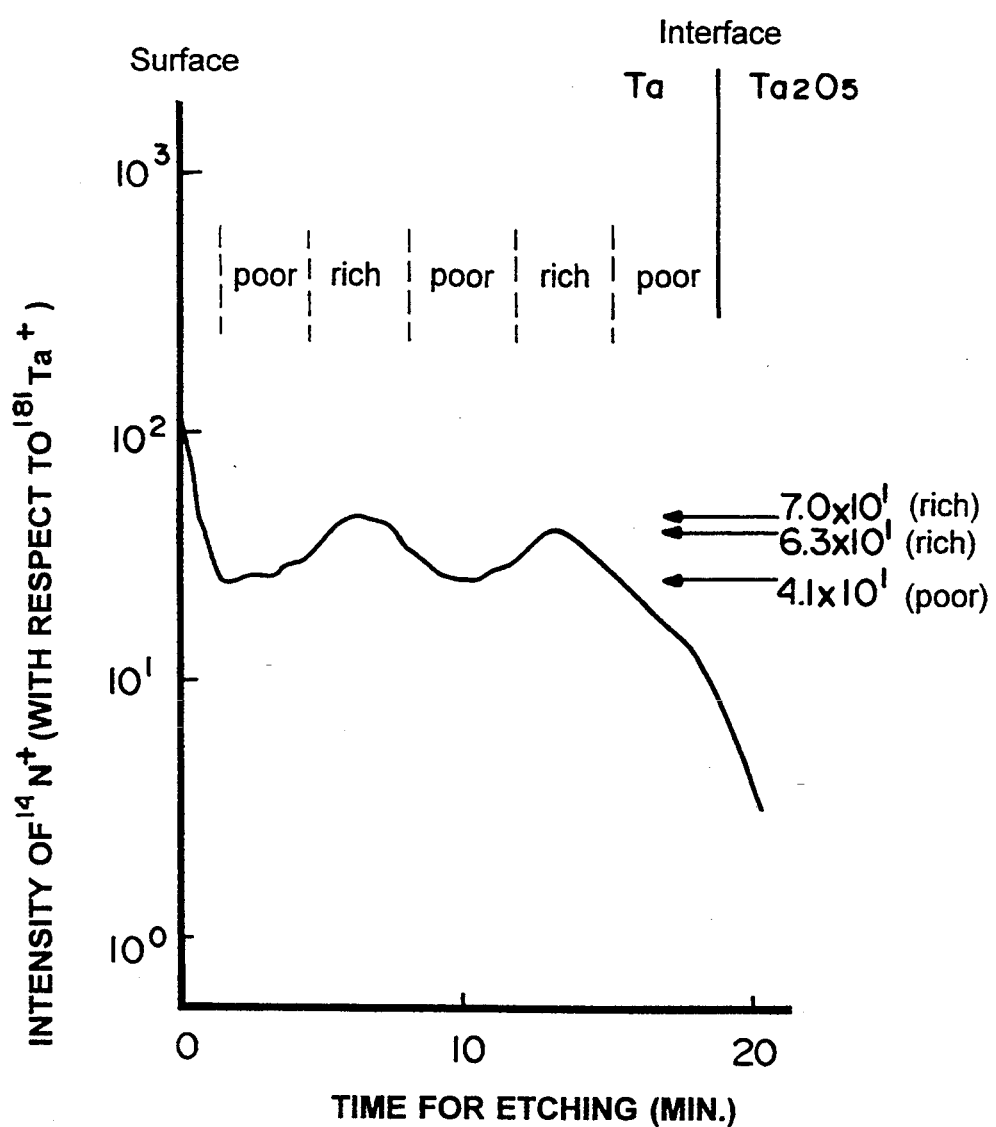
FIG. 3 is a diagram showing a profile of $^{14}N^+$ secondary ion emission from a thin Ta film (flow rate ratio of $N_2$ gas to $(Ar+N_2)$ gas: 4.3%) (distribution of nitrogen in the thin Ta film in the thickness direction of the thin Ta film) of Example 1 of the present invention.
Figure 4:
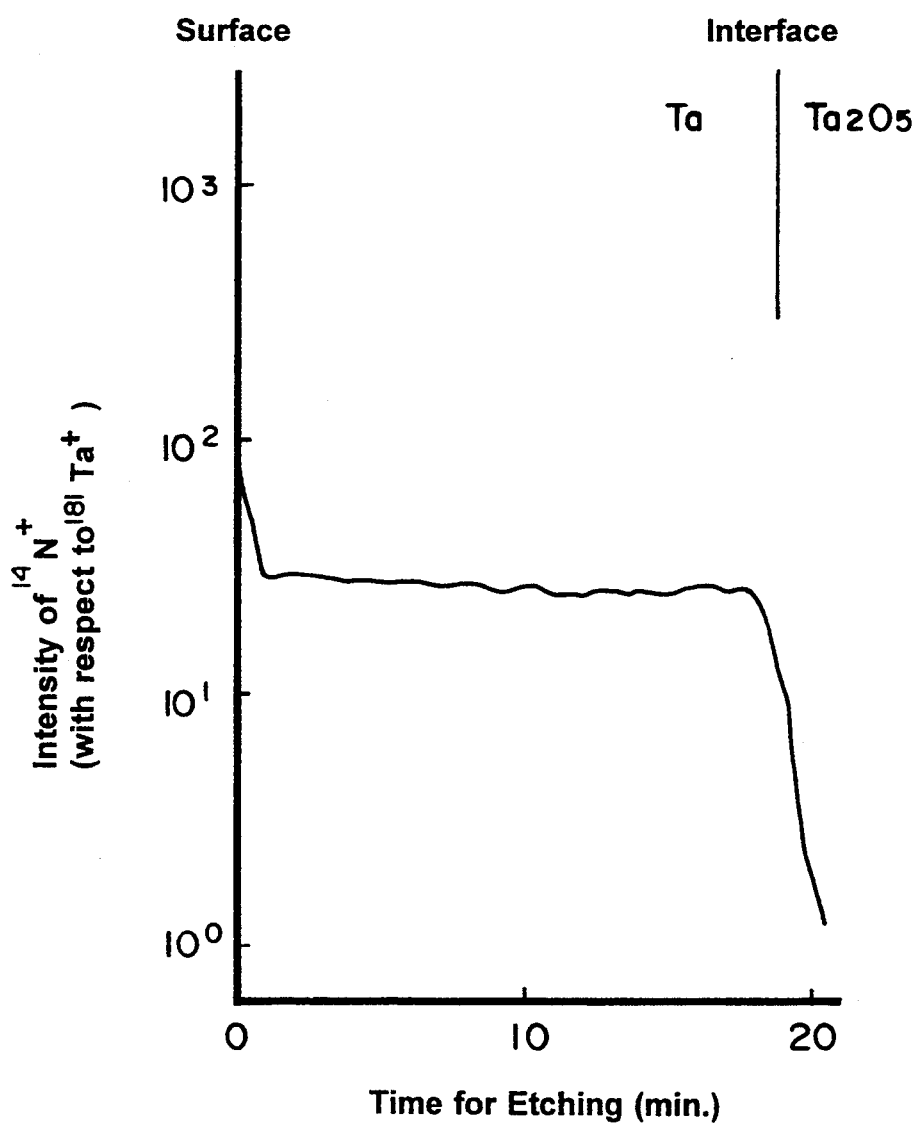
FIG. 4 is a diagram showing a profile of $^{14}N^+$ secondary ion emission from a conventional thin Ta film (flow rate ratio of $N_2$: 5%).

The thin Ta film thus obtained is analyzed by a SIMS (Secondary Ion Mass Spectrometry). FIG. 3 shows a profile of secondary ion emission from the Ta thin film. In this figure, the intensity of $^{14}N^+$ emission with regard to the intensity of $^{181}Ta^+$ emission is plotted. As shown in FIG. 3, the thin Ta film has a structure in which the poor portions and rich portions are alternately deposited in the thickness direction of the thin Ta film, excluding portions in the vicinity of a surface thereof. On the other hand, a thin Ta film uniformly containing nitrogen is obtained by the conventional reactive sputtering using a single piece of Ta target, as shown in FIG. 4.

The thin Ta film thus obtained is patterned into a desired shape by photolithography, thereby forming the signal lines 1 and lower electrodes 2. Then, the exposed portions of the signal lines 1 and lower electrodes 2 excluding terminal portions to be connected to the external driving circuit are anodized in 1 wt % of ammonium tartrate, thereby forming an anodized oxide film 3 (insulator 3). In this example, the anodization is conducted under the conditions that the temperature of an electrolyte, i.e., 1 wt % of ammonium tartrate, a voltage, and a current are approximately 25° C., 27 V and 0.7 mA, respectively, thereby obtaining the anodized oxide film 3 formed of $Ta_2O_5$ with a thickness of 600 angstroms.

After forming the anodized oxide film 3, a metal thin film is deposited over the substrate 6 by sputtering or the like. The deposited metal thin film is patterned into a desired shape by the photolithography, thereby forming the upper electrodes 4. In general, examples of materials for the upper electrode 4 include Ta, Cr, Ti, Al or the like. In this example, a Ti film is deposited so as to have a thickness of 4000 angstroms and patterned to form the upper electrodes 4. Each of the upper electrodes 4 is a rectangular shape having a length of 20 μm and a width of 5 μm.

Further, a transparent conductive film formed of ITO or the like is deposited over the resulting substrate 6 and patterned to form the pixel electrodes 5. In this way, the active matrix substrate is fabricated.

The active matrix substrate and counter substrate are attached to each other, thereby forming a liquid crystal cell. A plurality of strips of the transparent conductive film are formed on the counter substrate so that respective strips cross the signal lines 1 at right angles when the counter substrate is attached to the active matrix substrate. In this example, the strips are formed at 0.25 mm pitch. In this fabrication process of the counter substrate, if a color filter layer is formed on the counter substrate, a liquid crystal display apparatus capable of displaying color can be obtained.

The liquid crystal cell as mentioned above is fabricated as follows:

First, an orientation film is formed on a face of each of the active matrix substrate and the counter substrate at a temperature of approximately 200° C. Then, both of the substrates with the orientation films are rubbed in a prearranged direction in order to obtain liquid crystal molecule alignments.

Next, a sealing agent is coated onto one substrate and a spacer is uniformly dispersed on the other substrate; and the resulting substrates are attached to each other so that faces thereof with wirings face each other. The substrates are arranged so that the liquid crystal molecules will make a 90° twist going from one substrate to the other substrate. In this case, the strips of the transparent conductive film formed on the counter substrate and the signal lines 1 formed on the active matrix substrate should cross each other at right angles. The attached substrates are heated at a temperature of approximately 150° to 200° C. to cure the sealing agent while the substrate are pressed. After that, liquid crystal is injected between the substrates and then the resulting substrates are sealed. In this way, the liquid crystal cell is fabricated.

In addition, a transmitting polarizer having a transmittance of 44.5%, the degree of polarization of 96.5% is provided on a front face of the liquid crystal cell; and a reflective polarizer obtained by forming an Al reflective plate on the same polarizer as that provided on the front face is provided on the back face thereof. In this way, an electro-optic characteristic is added to the liquid crystal cell, thereby completing a liquid crystal display apparatus.

Figure 5:
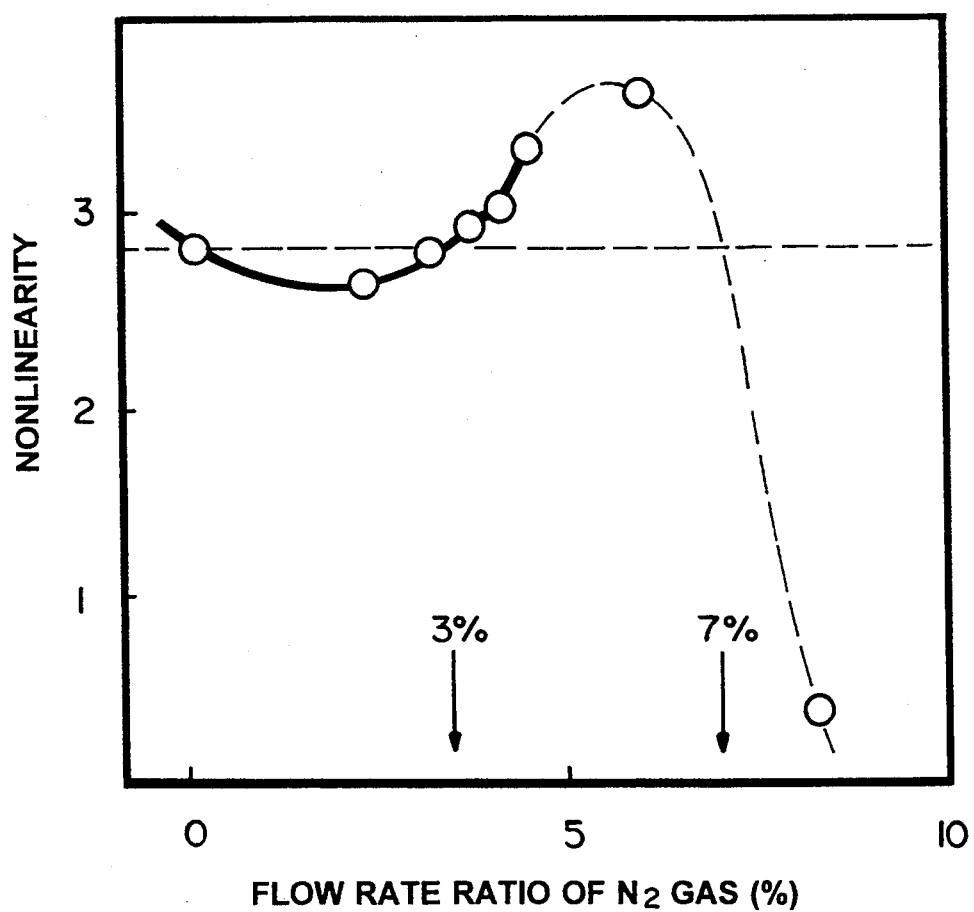
FIG. 5 is a diagram showing the relationship between the nonlinearity of an MIM device of Example 1 of the present invention and the flow rate ratio of $N_2$ gas.
Figure 35:
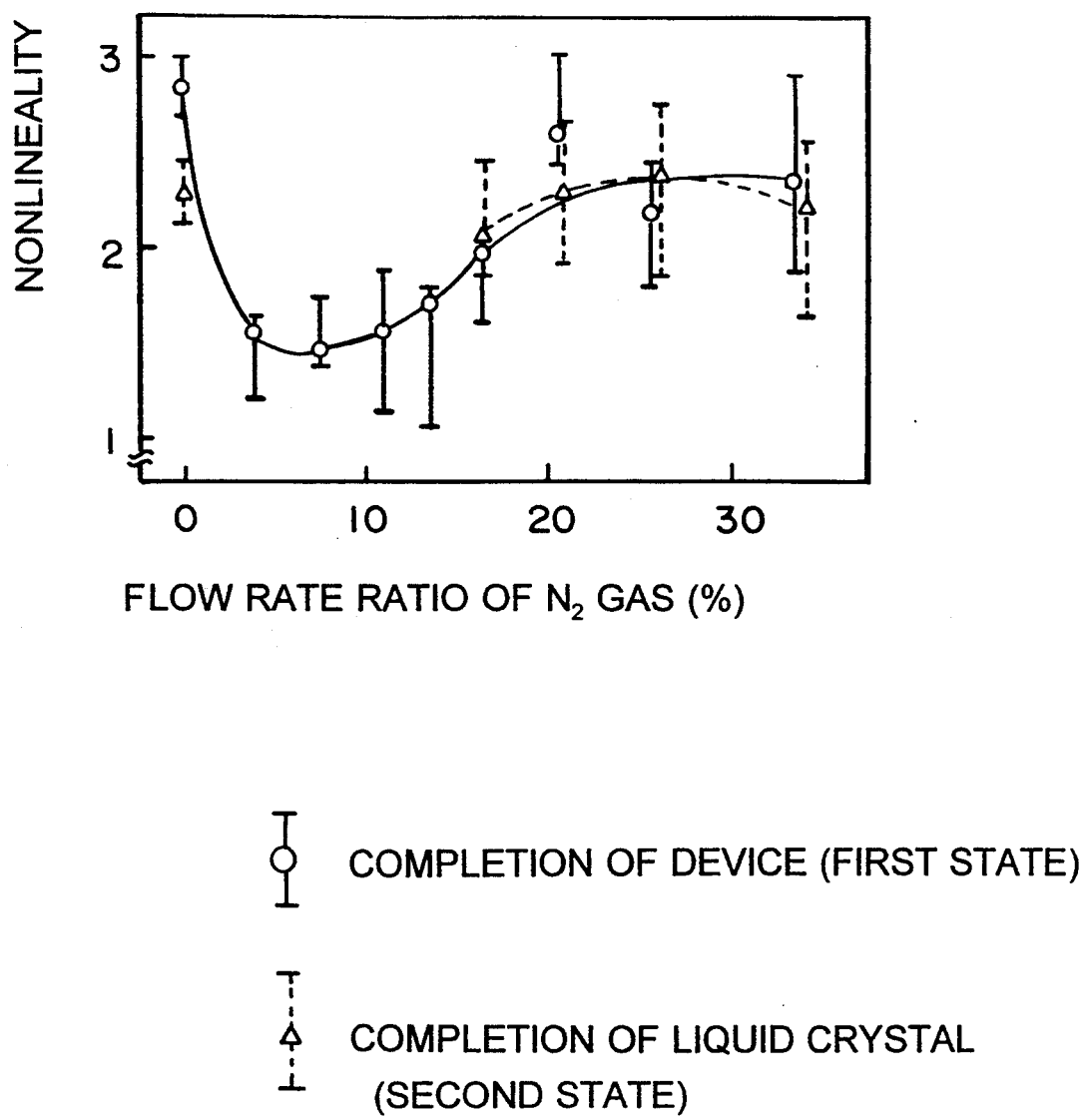
FIG. 35 is a diagram showing a relationship between the nonlinearity of a conventional MIM device and the flow rate ratio of $N_2$ gas to $(Ar+N_2)$ gas, while forming a thin Ta film.
Figure 36:
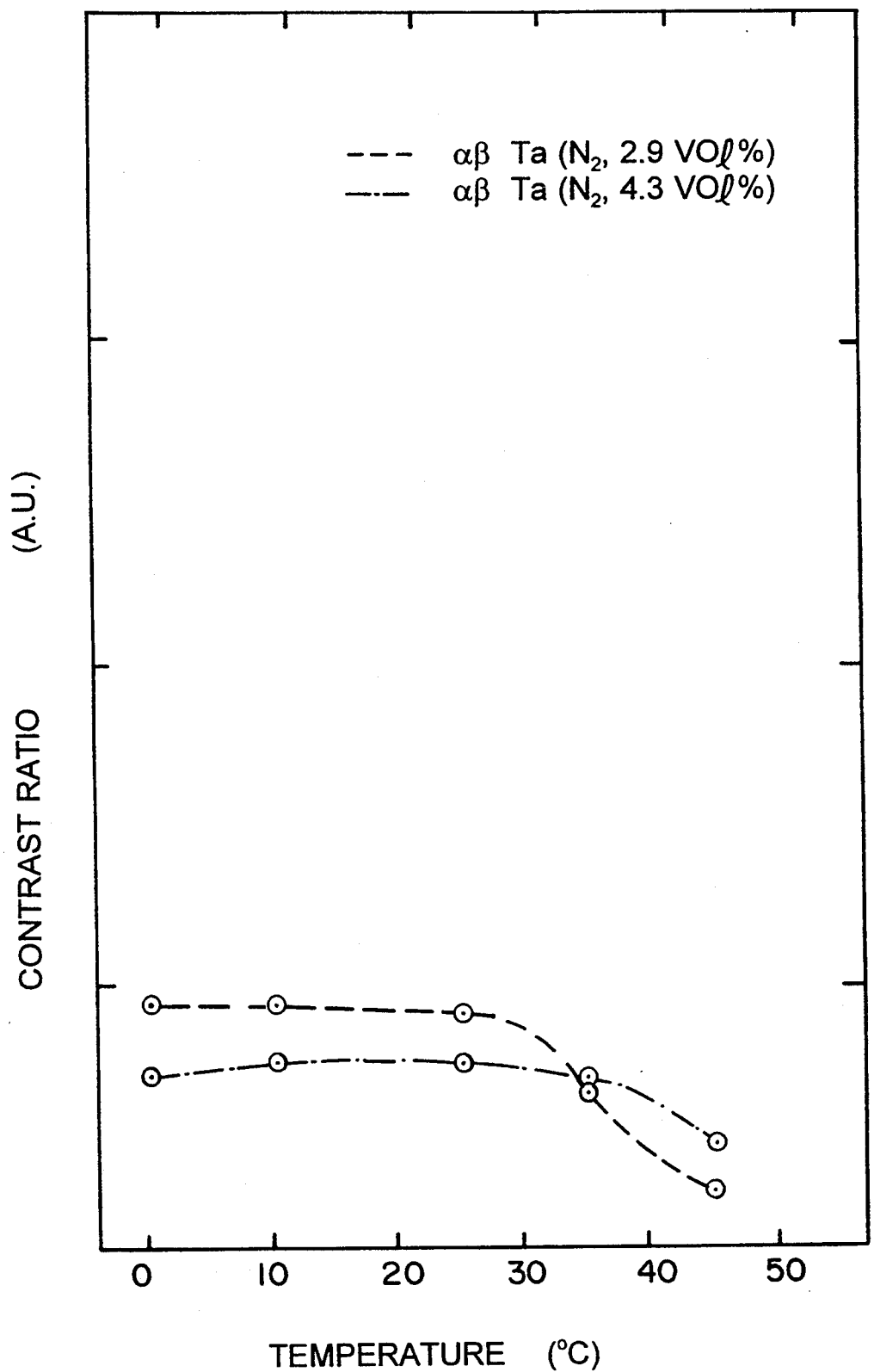
FIG. 36 is a diagram showing the temperature dependence of the contrast ratio of a liquid crystal display apparatus comprising conventional MIM devices.

FIG. 5 and Table 2 show the nonlinearity of the MIM device obtained in the above-mentioned manner. Table 2 also shows, as Comparative Example, the nonlinearity of the MIM device of a liquid crystal display apparatus obtained by the same manner as in this example except that the lower electrodes formed of a thin Ta film are formed by the conventional reactive sputtering using a single piece of Ta target. The nonlinearity of the MIM device of Comparative Example is as shown in FIG. 35. In Comparative Example, sputtering is conducted under the condition that the flow rate ratio of $N_2$ gas to $(Ar+N_2)$ gas is set at 0%, 3.8%, 7.4%, 10.7%, 13.8%, 16.7%, 20.0%, 25.0% and 33.3%. Analyses of the inventors of the present invention show that nitrogen is contained in the thin Ta film with 5% more by amount with respect to the flow rate ratio of $N_2$ gas in Comparative Example.

TABLE 2

| | Flow rate ratio of $N_2$ gas (%) | Nonlinearity First state | Nonlinearity Second state | Sputtering method (Reactive Sputtering) |
|---|---|---|---|---|
| Example | 2.2 | 2.6 | 2.6 | 3 pieces of |
| | 2.9 | 2.8 | 2.8 | target in series |
| | 3.6 | 3.0 | 3.0 | |
| | 4.1 | 3.3 | 3.2 | |
| | 4.3 | 3.3 | 3.3 | |
| | 5.7 | 3.6 | 3.4 | |
| Comparative Example | 0 | 2.9 | 2.3 | A single piece of target |
| | 3.8 | 1.6 | — | |
| | 7.4 | 1.5 | — | |
| | 10.7 | 1.6 | — | |
| | 13.8 | 1.8 | — | |
| | 16.7 | 1.9 | 2.1 | |
| | 20.0 | 2.6 | 2.3 | |
| | 25.0 | 2.2 | 2.3 | |
| | 33.3 | 2.4 | 2.2 | |

First State: The state after MIM Device is fabricated
Second State: The state when Liquid Crystal Display Apparatus is completed In Table 2, the first state represents a state immediately after the MIM device is fabricated, and the second state represents a state where the liquid crystal display apparatus is completed.

As is understood from FIG. 35 and Table 2, the nonlinearity of the MIM device of Comparative Example is not satisfactory in the case where the flow rate ratio of $N_2$ gas to $(Ar+N_2)$ gas is low (i.e., the amount of nitrogen contained in the thin Ta film is small). In this case, the deterioration of nonlinearity is caused, because a $\beta$ phase structure and an $\alpha$ phase structure are coexistent in the thin Ta film or the $\alpha$ phases monopolize the Ta thin film. In contrast, the nonlinearity of the MIM device is relatively satisfactory in the case of high flow rate ratio of $N_2$ gas. However, the nonlinearity is greatly different in respective MIM devices, and no MIM device having a uniform nonlinearity is obtained. In this case, the deposited film by sputtering becomes a thin TaN film. Further, in the case where the flow rate ratio of $N_2$ gas is 0%, a thin Ta film of a $\beta$ phase structure (hereinafter, referred to as "a $\beta$-Ta") is formed and the nonlinearity of the MIM device fabricated by use of such a thin Ta film is excellent. However, the nonlinearity is greatly deteriorated after the fabrication of the liquid crystal display apparatus through the heat treatment (second state), compared with the nonlinearity when the MIM device is fabricated (first state).

On the other hand, the MIM device of this example has an excellent nonlinearity and thermal stability, as shown in FIG. 5 and Table 2. Further, a uniform nonlinearity is obtained among the MIM devices. In particular, the nonlinearity of the MIM device is as good as or better than that of the MIM device fabricated by using the thin $\beta$-Ta film as the lower electrode, in the case where the thin Ta film is deposited by adjusting the flow rate ratio of $N_2$ gas to $(Ar+N_2)$ gas in the range of 3% to 7%. In this case, the nonlinearity does not deteriorate due to the heat treatment, and an excellent nonlinearity is obtained even in the second state. Further, MIM devices having the most excellent nonlinearity and thermal stability are obtained in the case where the flow rate ratio of $N_2$ gas to $(Ar+N_2)$ gas is in the range of 4.3% to 5.7%.

Figure 6:
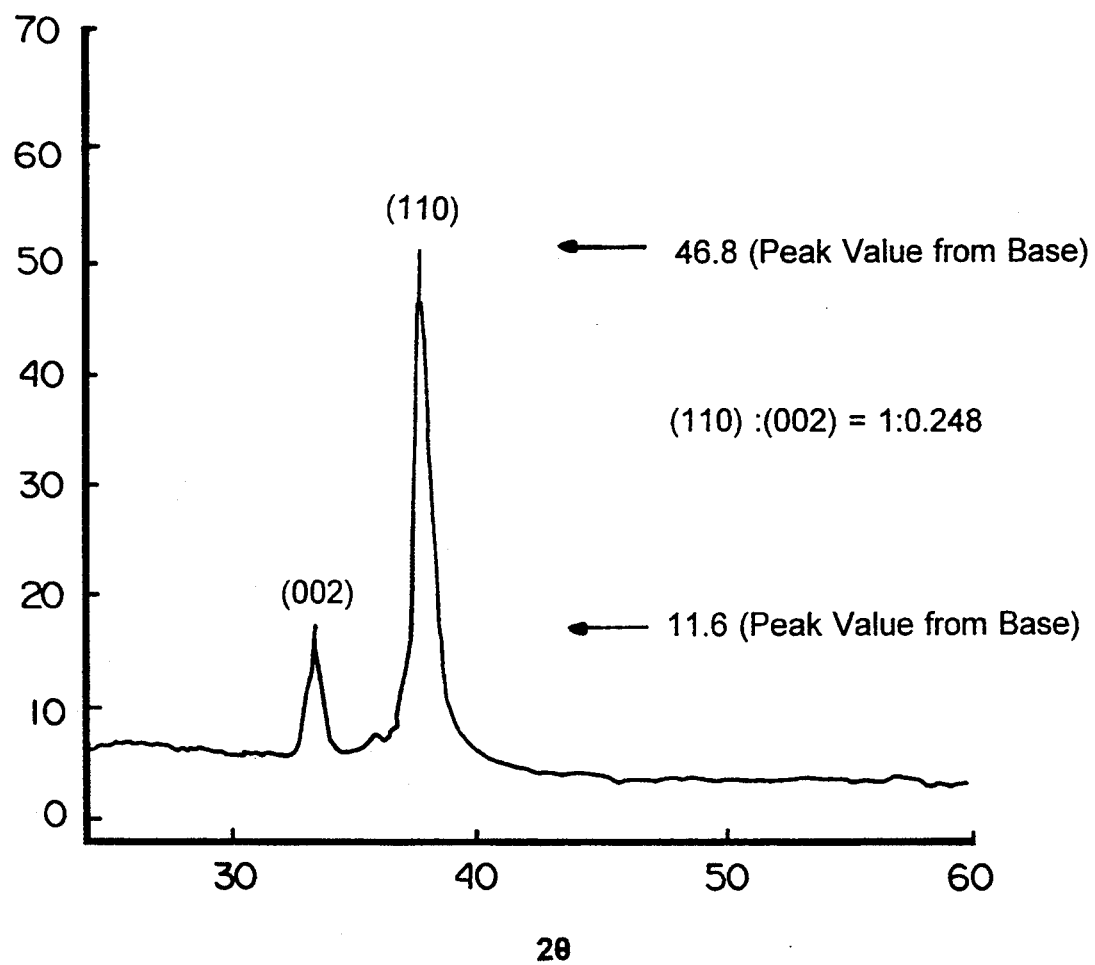
FIG. 6 is a diagram showing a profile of the intensity of X-ray diffraction of a thin Ta film (flow rate ratio of $N_2$ gas: 4.3%) of Example 1 of the present invention.
Figure 7:
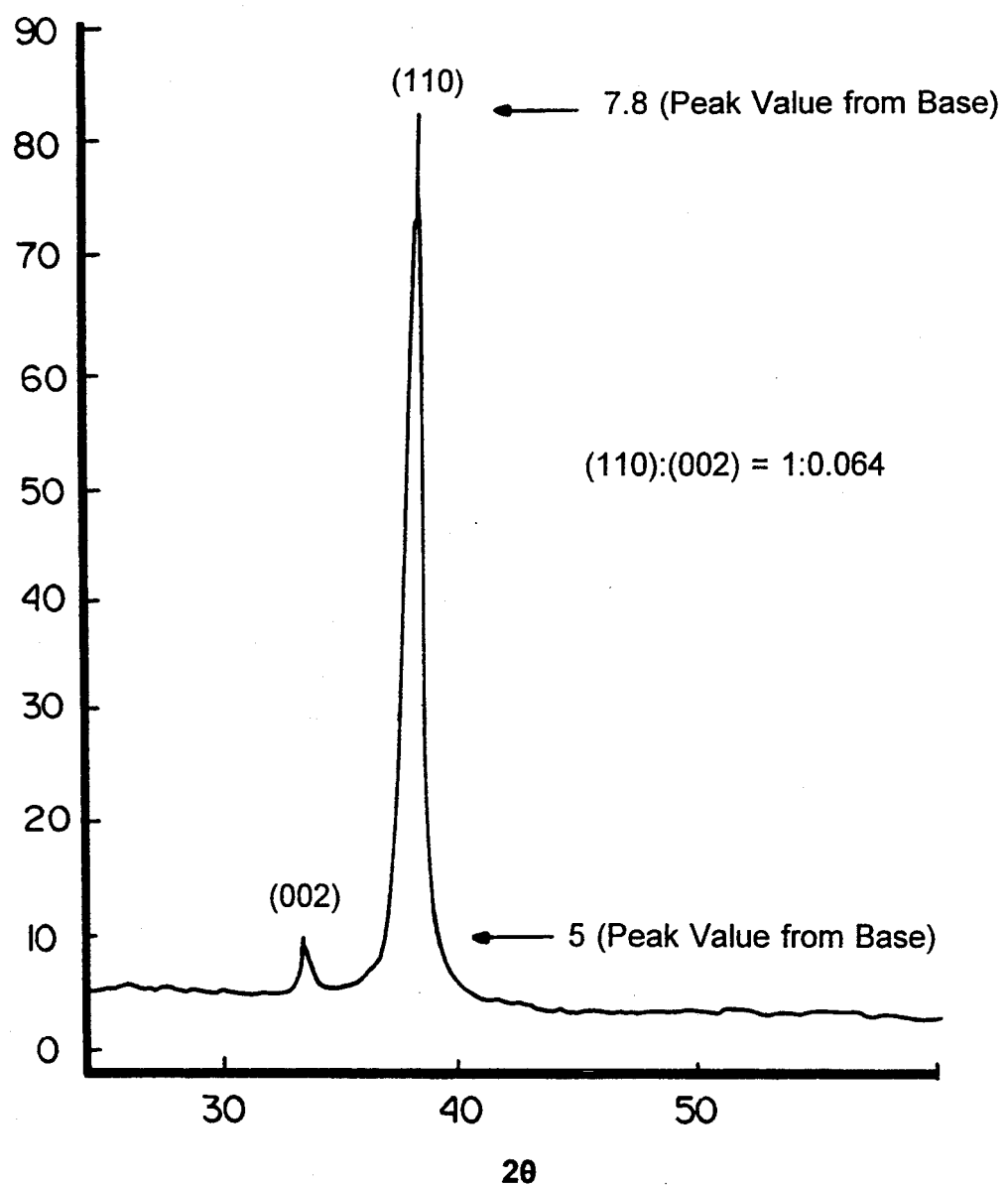
FIG. 7 is a diagram showing a profile of the intensity of X-ray diffraction of a thin Ta film (flow rate ratio of $N_2$ gas: 8.3%) of Example 1 of the present invention.

FIGS. 6 and 7 show the results of the X-ray investigation of the thin Ta films which are obtained under the conditions that the flow ratio of $N_2$ gas to $(Ar+N_2)$ gas is 4.3% and 8.3%, respectively. In these figures, the peak of (110) of the profile represents a Ta structure of $\alpha$ phase (hereinafter, referred to as "an $\alpha$-Ta"), and the peak of (200) of the profile represents the $\beta$-Ta. As shown in FIG. 6, the ratio of the X-ray intensity of (110) to the X-ray intensity of (200) is 1:0.248, in the case where the flow rate ratio of $N_2$ gas is 4.3%. Further, as shown in FIG. 7, the ratio of the X-ray intensity of (110) to the X-ray intensity of (200) is 1:0.064 in the case where the flow rate ratio of $N_2$ gas is 8.3%.

As shown in the result of the investigation by SIMS in FIG. 3, the ratio of the peak intensity of the $^{14}N+$ emitted from the poor portion to that of the rich portion is in the range of 1:1.54 to 1:1.71, in the case where the thin Ta film is deposited under the condition that the flow rate ratio of $N_2$ gas to $(Ar+N_2)$ gas is 4.3%.

Figure 8:
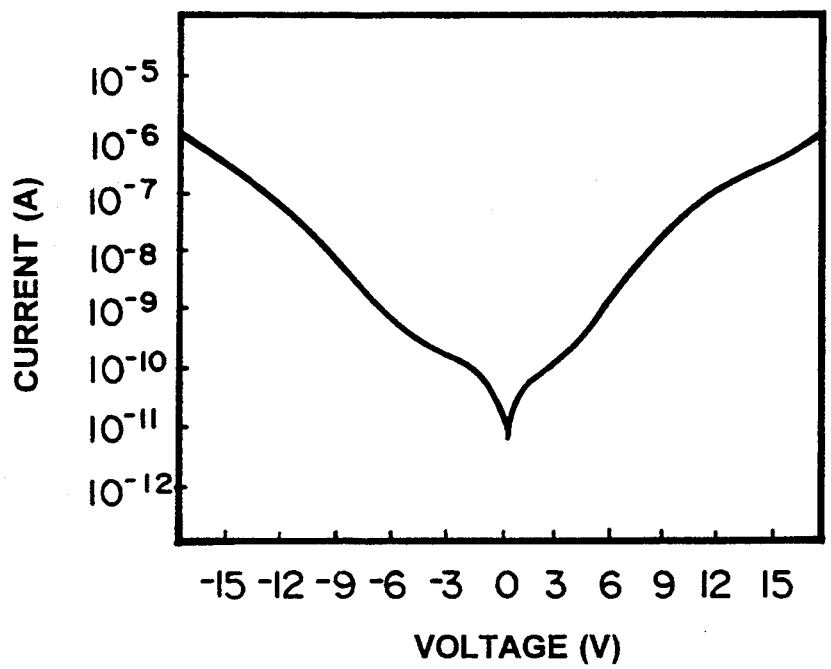
FIG. 8 is a diagram showing a current-voltage characteristic of an MIM device (flow rate ratio of $N_2$ gas to $(Ar+N_2)$ gas: 4.3%) of Example 1 of the present invention.

FIG. 8 shows a voltage-current characteristic of the MIM device of this example. As is understood from FIG. 8, the symmetry of current curves of a negative applied voltage and a positive applied voltage can also be obtained in the MIM device of this example.

Figure 9:
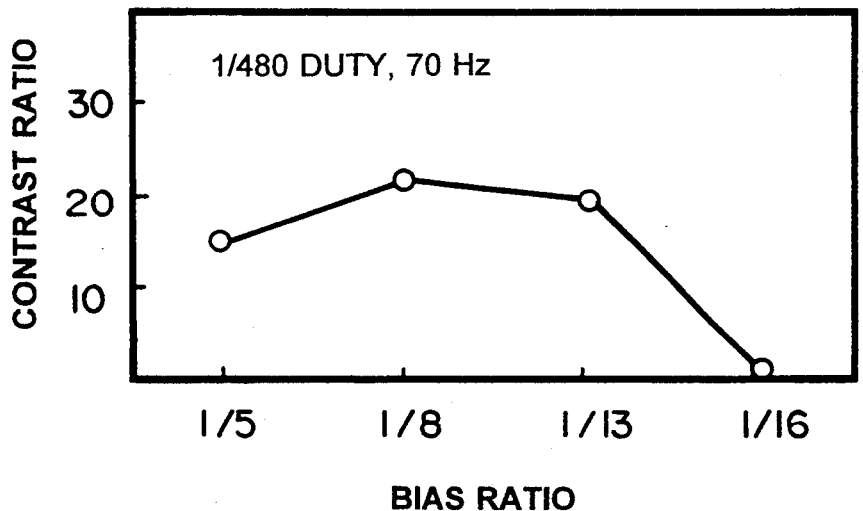
FIG. 9 is a diagram showing an electro-optic characteristic (1/480 Duty, 70 Hz) of a liquid crystal display apparatus using an MIM device (flow rate ratio of $N_2$ gas to $(Ar+N_2)$ gas: 4.3%) of Example 1 of the present invention.

FIG. 9 shows an electro-optic characteristic (the contrast ratio dependence of the bias ratio) in the liquid crystal display apparatus using the MIM devices as switching elements. As is understood from FIG. 9, the liquid crystal display apparatus has the contrast ratio of 20 in the case of the bias ratio of ⅛ and 1/13. Further, the liquid crystal display apparatus has excellent characteristics such as the response rate ($=\tau r + \tau d$) of 70 msec and the viewing angle of 40° in the up-and-down direction and of 100° or more in the right-and-left direction ($Co \geq 2$). Moreover, an excellent display can be obtained in the case of displaying a binary image, since a residual image does not occur, as this is the greatest problem in a liquid crystal display apparatus using two-terminal nonlinear devices as switching devices. This is because the above-mentioned nonlinearity of the voltage-current characteristic is excellent.

In this example, sputtering is conducted in an atmosphere of $(Ar+N_2)$ gas using three pieces of Ta target, so that the deposited thin Ta film has a structure in which the poor portions and rich portions are alternately deposited in the thickness direction of the thin Ta film; however, another method can be used to obtain the thin Ta film having such a structure. For example, several pieces of sintered TaN target containing a small amount of nitrogen and sintered TaN target containing a large amount of nitrogen are alternately arranged in series and then sputtered, whereby a thin Ta film having the same alternate structure as that of this example can be obtained.

As mentioned above, since the lower electrode of the two-terminal nonlinear device has the structure in which the poor portions (containing a small amount of nitrogen) and the rich portions (containing a large amount of nitrogen) are alternately deposited, the two-terminal nonlinear device of this example has an initial nonlinearity as good as or better than that of the two-terminal nonlinear device using a thin β-Ta film as the lower electrode, and an excellent thermal stability close to that of the two-terminal nonlinear device using the TaN film. Further, the nonlinearity is uniform among the two-terminal nonlinear devices. Moreover, the two-terminal nonlinear device of this example is excellent in the current-voltage characteristic. Accordingly, when the two-terminal nonlinear devices are used as switching elements in a liquid crystal display apparatus, an occurrence of the residual image is greatly reduced, thereby obtaining a display with high contrast and high quality.

Example 2

A second example of the present invention will be described.

In this example, a thin Ta film is deposited by sputtering using sintered TaN target, different from a reactive sputtering in an atmosphere of $(Ar+N_2)$ gas using three pieces of pure Ta target as in Example 1.

Figure 10:
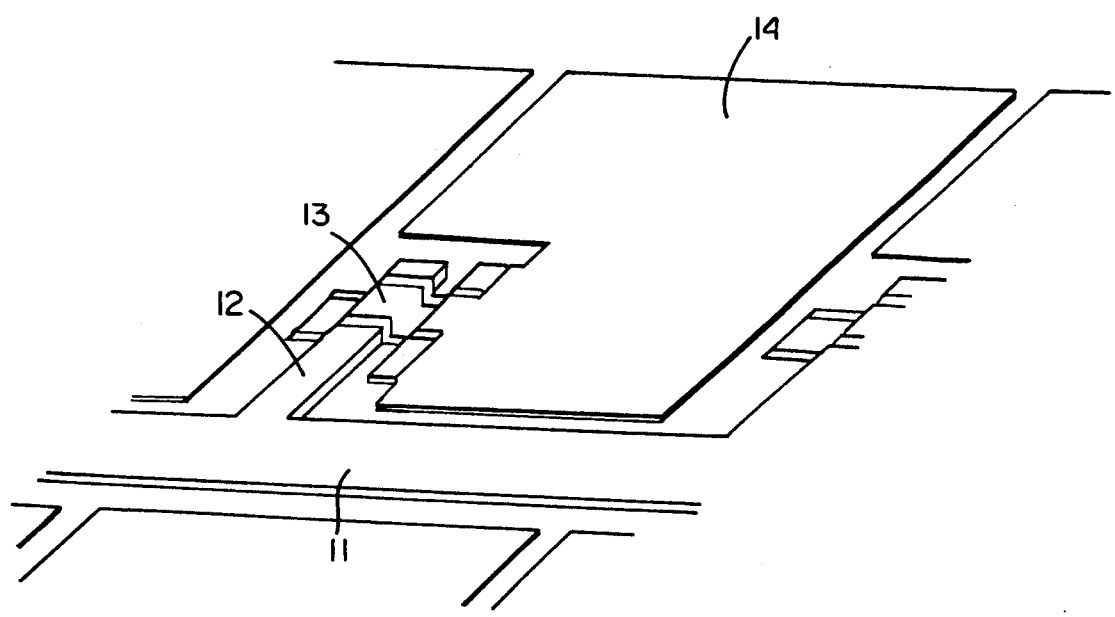
FIG. 10 is a perspective view of an active matrix substrate on which two-terminal nonlinear devices of Example 2 of the present invention.
Figure 11:
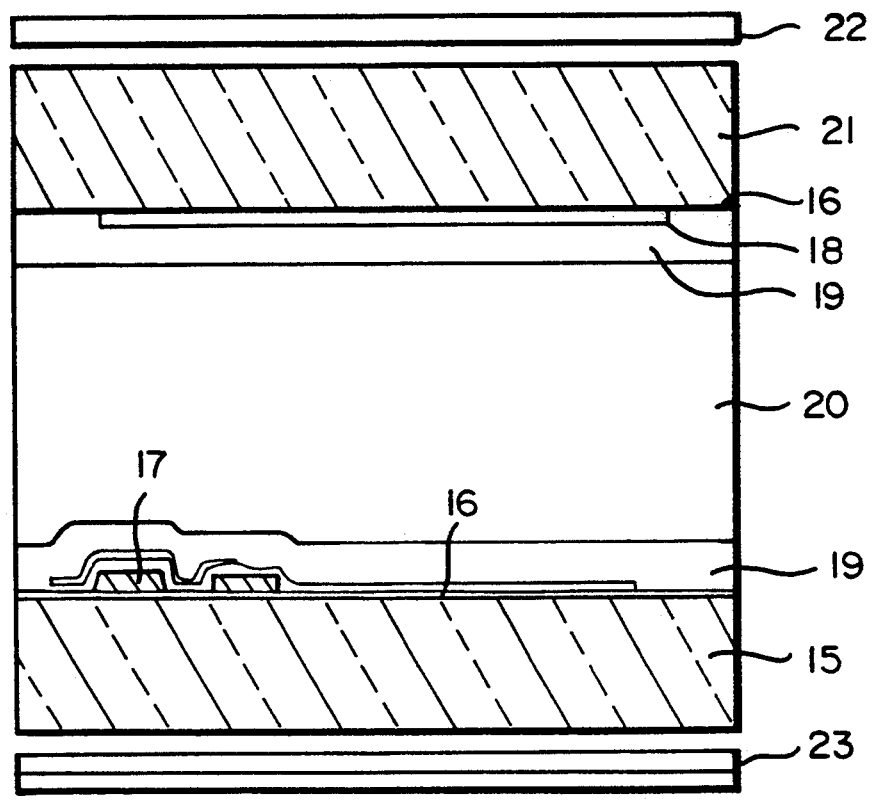
FIG. 11 is a cross-sectional view of a liquid crystal display apparatus comprising an active matrix substrate of FIG. 10.

FIG. 10 shows a perspective view of an active matrix substrate bearing two-terminal nonlinear devices of an MIM type (hereinafter, referred to as "an MIM device"), in the case where the MIM devices are used as switching devices of a liquid crystal display apparatus. FIG. 11 shows a cross-sectional view of the liquid crystal display apparatus comprising the active matrix substrate of FIG. 10.

The structure of the active matrix substrate will be described with reference to FIGS. 10 and 11. The active matrix substrate comprises a substrate 15 formed glass or the like. A base coating insulator 16 is formed on the glass substrate 15 and a plurality of signal lines 11 formed of Ta are provided thereon in parallel. Further, lower electrodes 12 branched from the signal lines 11 are formed on the base coating insulator 16. On the signal lines 11 and the lower electrodes 12, insulators are formed. The insulators are obtained by anodizing the exposed portions of the signal lines 11 and the lower electrodes 12. Upper electrodes 13 of Ta, Cr, Ti, Al, or the like are formed on the insulators. The MIM device comprises one lower electrode 12, one upper electrode 13, and one insulator sandwiched therebetween. The upper electrode 13 is electrically connected to the corresponding one of the pixel electrodes 14 formed of an ITO transparent conductive film or the like.

The active matrix substrate shown in FIG. 10 is fabricated under the conditions that a liquid crystal cell has a reflective monochrome TN liquid crystal mode having 640×480 dots and 0.3 mm pitch; the width of each signal line 11 is 40 μm; the size of the MIM device is 6 μm×5 μm; and the ratio of the MIM capacity to the liquid crystal capacity is approximately 1:10.

First, the base coating insulator 16 formed of $Ta_2O_5$ or the like is deposited on the glass substrate 15 by sputtering or the like so as to have a thickness of 5000 angstroms. Examples of materials for the glass substrate 15 include no-alkali glass, borosilicate glass and soda-lime glass. In this example, #7059 Fusion Pilex Glass (manufactured by Corning Japan Co., Ltd.) is used for the glass substrate 15. The base coating insulator 16 can be omitted. However, thin films formed on the base coating insulator 16 can be prevented from being contaminated by the glass substrate 15, thereby obtaining further excellent device characteristics.

Successively, the thin Ta film is deposited on the glass substrate 15 so as to have a thickness of 3000 angstroms by DC (Direct Current) sputtering. In this example, sintered TaN containing 5 mol % of nitrogen is used as a target. Further, the DC sputtering is conducted in an atmosphere of argon (Ar) gas under the condition that the gas pressure is $4\times10^{-1}$ Pa; the DC power is 2.6 kW; the temperature and the time for heating the substrate are 100° C. and 180 seconds, respectively; the conveyance rate of the substrate is 100 mm/min; and the interval between the substrate and the target is 77 mm.

The thin Ta film thus obtained is patterned into a desired shape by photolithography, thereby forming the signal line 11 and lower electrode 12. Then, surfaces of the signal line 11 and lower electrode 12 excluding terminal portions to be connected to the external driving circuit are anodized in 1 wt % of ammonium tartrate as an electrolyte, thereby forming the anodized oxide film. In this example, the anodization is conducted under the conditions that the temperature of the electrolyte is approximately 25° C.; the voltage is approximately 27 V; and the current is 0.7 mA, thereby obtaining the anodized oxide film of $Ta_2O_5$ having a thickness of 600 angstroms.

After the anodization, a metal thin film is deposited over the glass substrate 15 by sputtering or the like. The resulting substrate 15 is patterned into a desired shape by the photolithography, thereby forming the upper electrode 13. In this way, the MIM device is fabricated. In general, examples of materials for the upper electrode 13 include Ta, Cr, Ti, Al and the like. In this example, the Ti film is deposited so as to have a thickness of 4000 angstroms and patterned to form the upper electrodes 13. Each upper electrode 13 has a rectangular shape having a length of 20 μm and a width of 6 μm.

Further, a transparent conductive film of ITO or the like is formed over the resulting substrate 15 and patterned by a well-known method to form the pixel electrodes 14. In this way, the active matrix substrate is fabricated.

The active matrix substrate and a counter substrate are attached to each other, thereby constituting a liquid crystal cell. A plurality of strips of a transparent conductive film are formed on the counter substrate 21 so that respective strips cross the signal lines 11 on the active matrix substrate 15 at right angles. The strips work as counter electrodes 18. In this example, the strips of the transparent conductive film having a thickness of 1000 angstroms are formed at 0.3 mm pitch. In this fabrication of the counter electrode, if a color filter layer is formed on the counter substrate, a liquid crystal display apparatus capable of displaying color can be obtained.

The liquid crystal cell including the counter substrate and the counter substrate is fabricated as follows:

First, an orientation film 19 is formed on a surface of each of the active matrix substrate and the counter substrate at a temperature of approximately 200° C. Then, both of the orientation films 19 are rubbed in a prearranged direction. In this example, the orientation treatment is conducted under the condition that the twist angle of liquid crystal molecules is 90°.

Then, a thermosetting sealing agent is coated onto one substrate and a spacer is uniformly dispersed on the other substrate; and the resulting substrates are attached to each other so that faces thereof bearing the wiring face each other. The active matrix substrate and the counter substrate are arranged so that the rubbing directions of the orientation films 19 are 90° relative to each other and the liquid crystal molecules will make a 90° twist going from one substrate to the other substrate. In this case, the wirings on the active matrix substrate and the counter electrodes 18 on the counter substrate should cross each other. The attached substrates are heated at a temperature of approximately 150° C. to 200° C. to cure the sealing agent while the substrates are pressed. After that, liquid crystal is injected between the substrates and then the resulting substrates are sealed. In this way, the liquid crystal cell is fabricated.

In addition, a transmitting polarizer 22 having a transmittance of 44.5%, the degree of polarization of 96.5% is provided on the front face of the liquid crystal cell; and a reflective polarizer 23 obtained by forming an Al reflective plate on the same polarizer as the polarizer 22 is provided on the back face thereof. In this way, an electro-optic characteristic is added to the liquid crystal cell, thereby completing a liquid crystal display apparatus.

Figure 12:
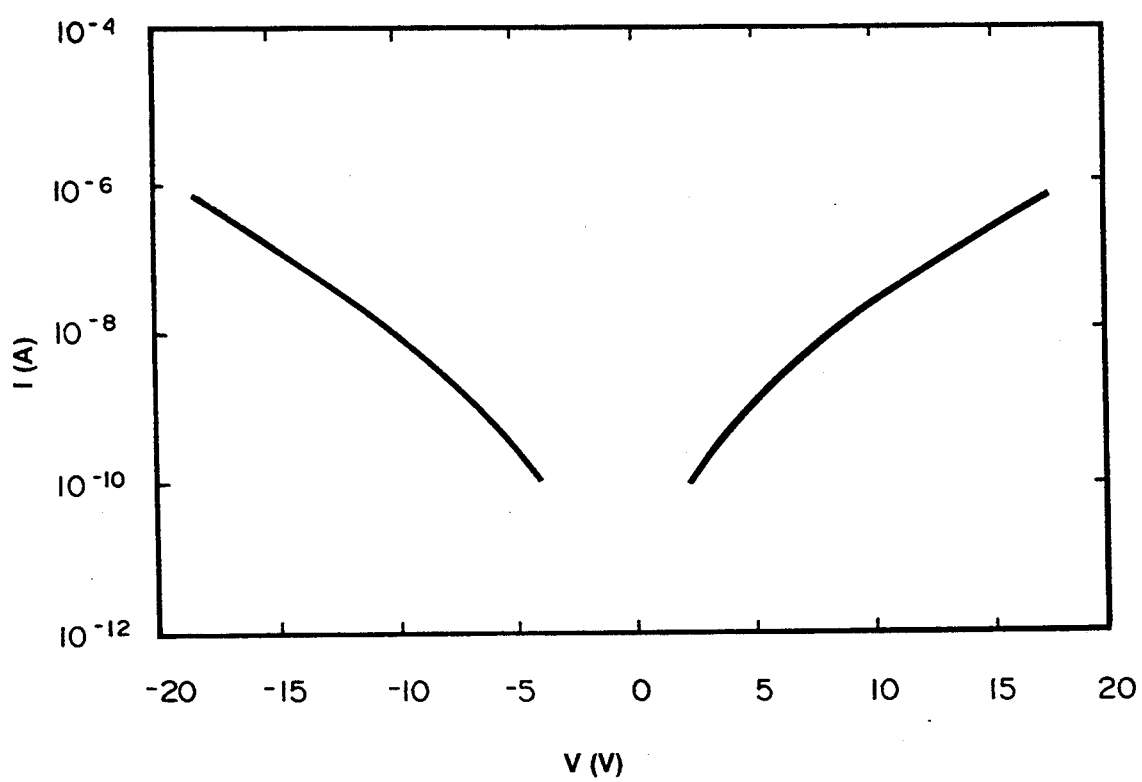
FIG. 12 is a diagram showing a current-voltage characteristic of an MIM device of Example 2 of the present invention.
Figure 13:
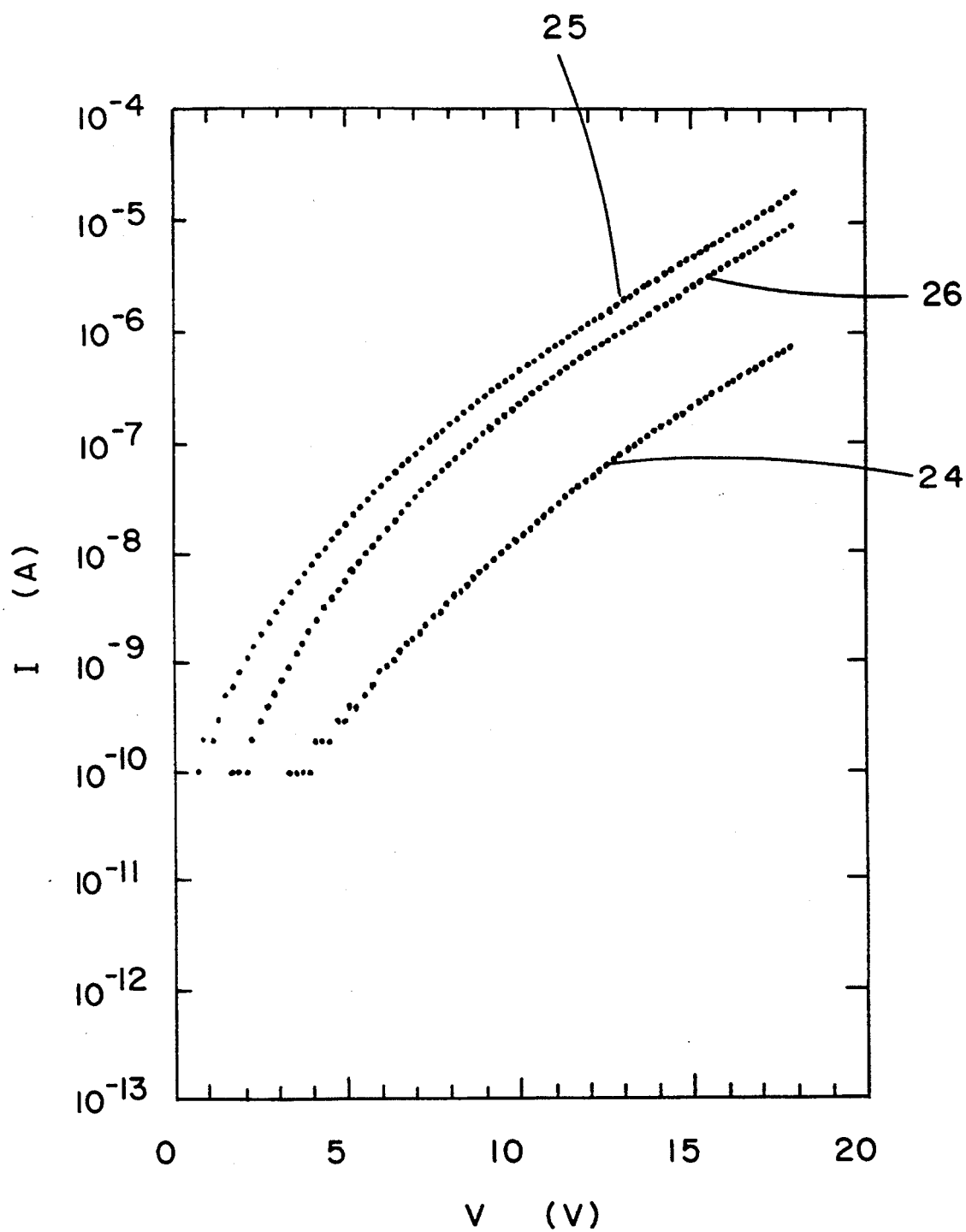
FIG. 13 is a diagram showing a current-voltage characteristic of an MIM device of Example 2 of the present invention and an MIM device of Comparative Example.

FIG. 12 shows a current-voltage characteristic of the MIM device of this example. In FIG. 12, a positive voltage is obtained in the case where a current flows from the lower electrode 12 to the upper electrode 13. Further, FIG. 13 shows the current-voltage characteristic as a curve 24. FIG. 13 also shows, as Comparative Examples 1 and 2, two types of current-voltage characteristics of the MIM device obtained in the same way as in this example except that a thin Ta film is deposited by a reactive sputtering in an atmosphere of (Ar+N$_2$) gas. The flow rate ratio of N$_2$ gas to (Ar+N$_2$) gas is set at 2.9 vol % and 4.3 vol %, respectively in Comparative Examples 1 and 2. The current-voltage characteristics of Comparative Examples 1 and 2 are respectively represented as curves 25 and 26 in FIG. 13.

A current flowing in the insulator sandwiching between the lower electrode and the upper electrode, or a current flowing through interfaces between the electrodes and the insulator in the MIM device, will now be described. The current is represented by a Poole-Frenkel current shown as the following Formula (1):

$$\ln (I/V) = \ln A + B \sqrt{V} \tag{1}$$

wherein, I and V represent a current and a voltage, respectively; coefficients A and B represent the conductivity and the nonlinearity of the MIM device. In this case, as A is increased, the resistance of the MIM device is reduced; and as B is increased, the ratio of ON voltage to OFF voltage ($V_{ON}/V_{OFF}$) in the vicinity of the threshold voltage is increased, making it possible to obtain a liquid crystal display apparatus with high contrast.

Figure 14:
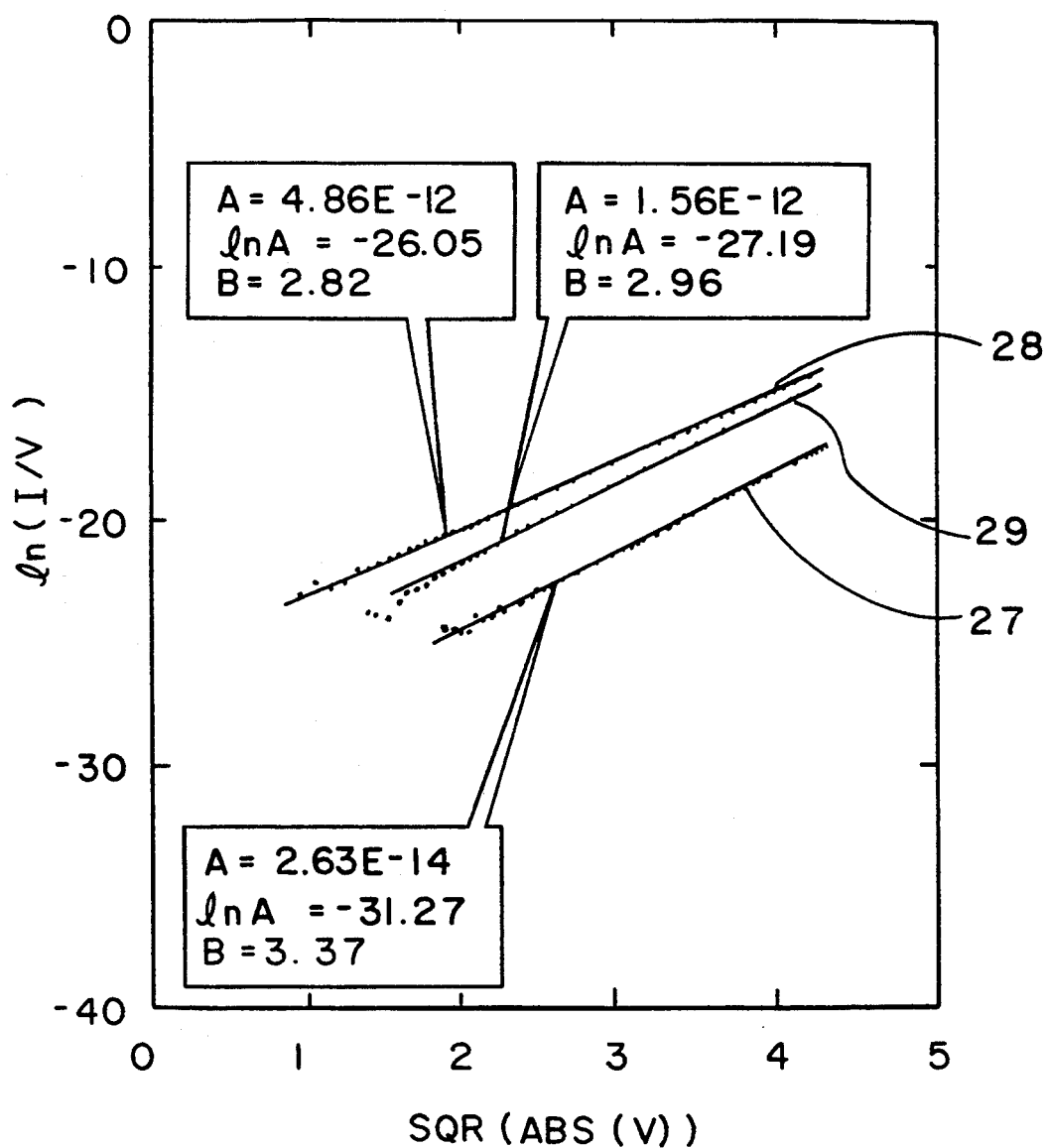
FIG. 14 shows a Poole-Frenkel plot of each of an MIM device of Example 2 and an MIM device of Comparative Example.

FIG. 14 shows a Poole-Frenkel Plot of the MIM device, regarding the curves 24, 25 and 26. Lines 27, 28 and 29 are the Poole-Frenkel Plots of the MIM device of this example (curve 24), Comparative Example 1 (curve 25), and Comparative Example 2 (curve 26), respectively. A Y intercept represents the conductivity of the MIM device (lnA) and a gradient of the line represents the nonlinearity of the MIM device. FIG. 14 also shows values of the coefficients A and B of the MIM device of this example and Comparative Examples 1 and 2.

As is understood from FIG. 14, the MIM device of this example using a thin Ta film deposited by sputtering using sintered TaN as a target has a smaller coefficient A and larger coefficient B, compared with the MIM devices of Comparative Examples 1 and 2 using a thin Ta film deposited by reactive sputtering in an atmosphere of (Ar+N$_2$) gas. That is to say, the MIM device of this example has a small conductivity and therefore a larger resistance, leading to a smaller leak current. Moreover, an excellent nonlinearity can be obtained.

Further, in this example, since the thin Ta film is deposited by DC sputtering using sintered TaN as a target, nitrogen is doped into the thin Ta film. As a result, the deterioration in characteristics of the MIM device caused by the heat treatment during the fabrication of the liquid crystal cell can be prevented.

Figure 15:
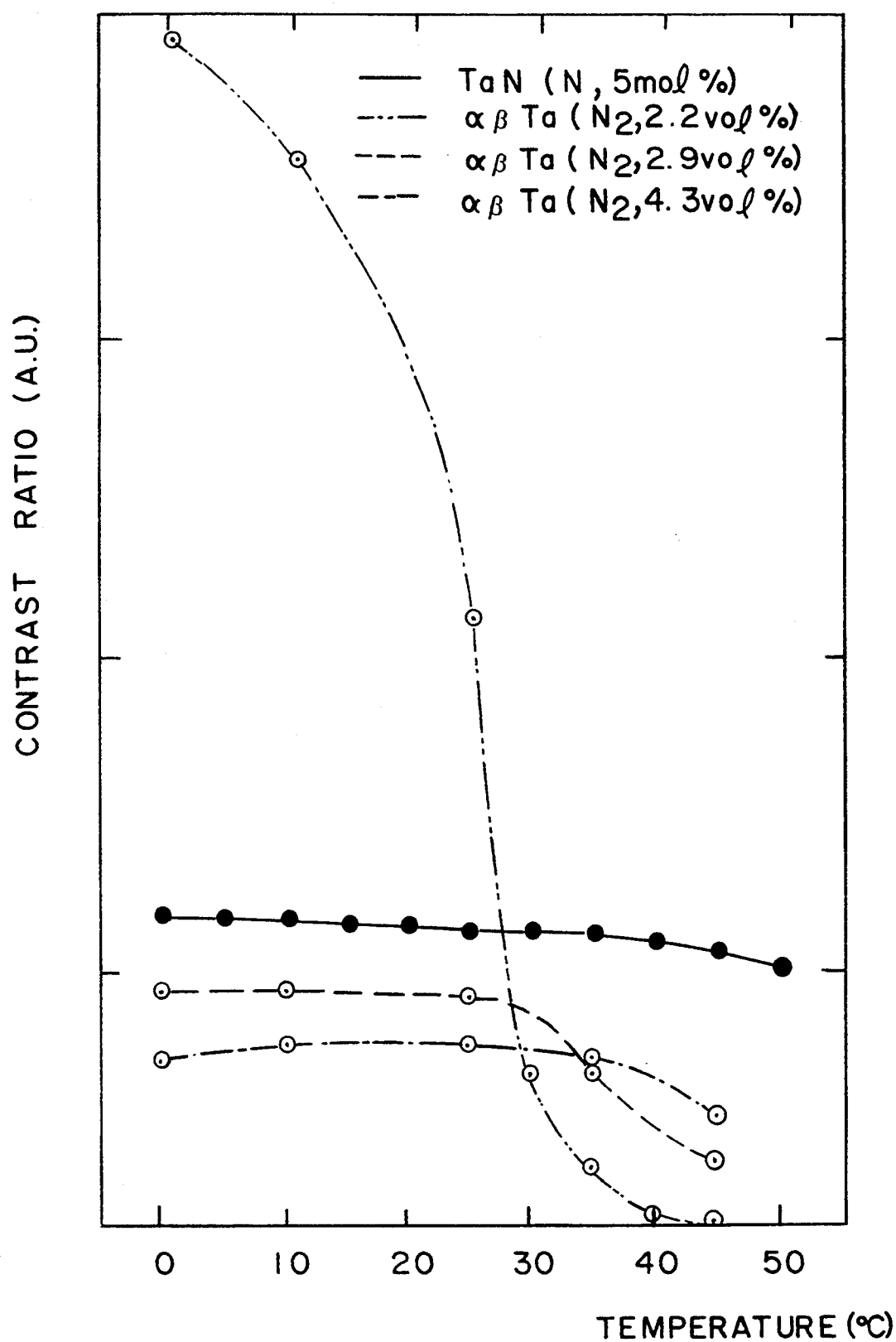
FIG. 15 is a diagram showing the temperature dependence of the contrast ratio of a liquid crystal display apparatus comprising MIM devices of Example 2 and a liquid crystal display apparatus comprising MIM devices of Comparative Example.

FIG. 15 shows an electro-optic characteristic (temperature dependence of the contrast ratio) of a liquid crystal display apparatus having the MIM devices of this example, together with those of liquid crystal display apparatuses of Comparative Examples 1, 2 and 3. In Comparative Examples 1, 2 and 3, respective thin Ta films deposited by the reactive sputtering in an atmosphere of (Ar+N$_2$) gas are used as lower electrodes, the flow rate ratio of N$_2$ gas to (Ar+N$_2$) gas being 2.9 vol %, 4.3 vol % and 2.2 vol %, respectively. (Here, a broken-line, a dash-dot line, and a two-dot dash line represent the contrast ratios of Comparative Examples 1, 2 and 3, respectively.)

As is understood from FIG. 15, in Comparative Examples 1, 2 and 3, the contrast ratio is decreased when the temperature exceeds room temperature. That is to say, the liquid crystal display apparatus using the MIM device of this example has a stable display characteristic against temperature changes.

However, when the flow rate ratio of N$_2$ gas to (Ar+N$_2$) gas is as large as 6 vol % in Comparative Examples 1, 2 and 3, the nonlinearity of the MIM device can be excellent. Moreover, even at a high temperature, the contrast ratio is not reduced due to the deterioration of the nonlinearity of the MIM device. However, as the flow rate ratio of N$_2$ gas is increased, the amount of nitrogen taken into the Ta film is not uniform, leading to a great difference in the nonlinearity of the MIM devices. As a result, a uniform display cannot be obtained.

In this example, sintered TaN containing 5 mol % of nitrogen is used as a target; however, the amount of nitrogen is not limited thereto. Any sintered TaN can be used as a target for forming the thin Ta film, as long as sintered TaN can contain the amount of nitrogen needed to obtain the nonlinearity as good as or better than that of the MIM device using the $\beta$-Ta film doped with no nitrogen.

Figure 16:
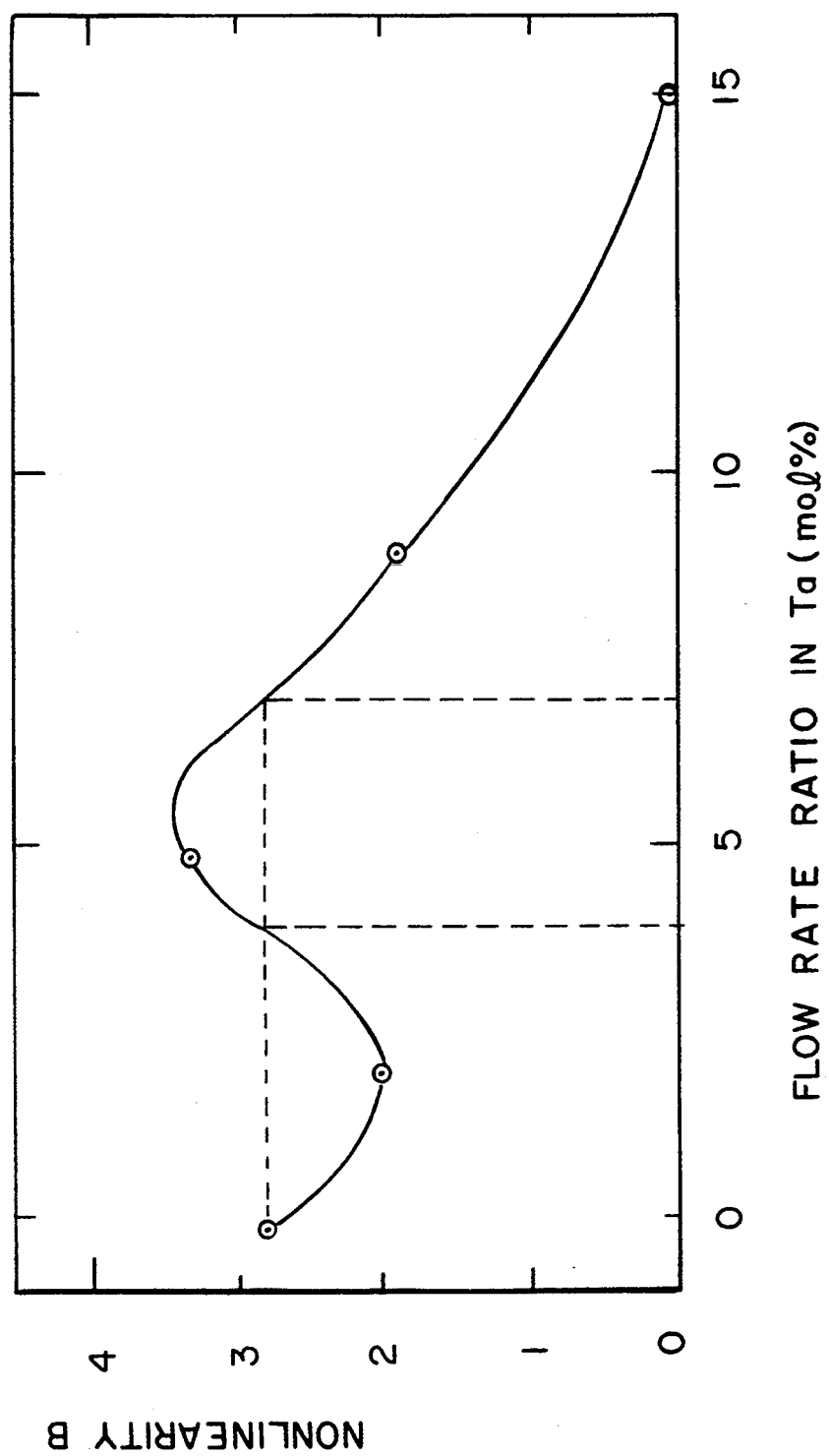
FIG. 16 is a diagram showing the relationship between the amount of nitrogen in sintered TaN and the nonlinearity B of an MIM device formed by using sintered TaN as a target.

FIG. 16 shows the relationship between the amount of nitrogen in sintered TaN used as a target and the nonlinearity of the MIM device having the thin Ta film obtained by using sintered TaN as a target. As is understood from FIG. 16, the nonlinearity of the MIM device obtained by use of a single piece of sintered TaN target containing nitrogen in the range of 4 to 7 mol % is as good as or better than that of the MIM device using the $\beta$-Ta film doped with no nitrogen; however, the nonlinearity of the MIM device obtained by the use of a single piece of sintered TaN target containing nitrogen out of the range is not as good as that of the MIM device using the β-Ta film.

Figure 17:
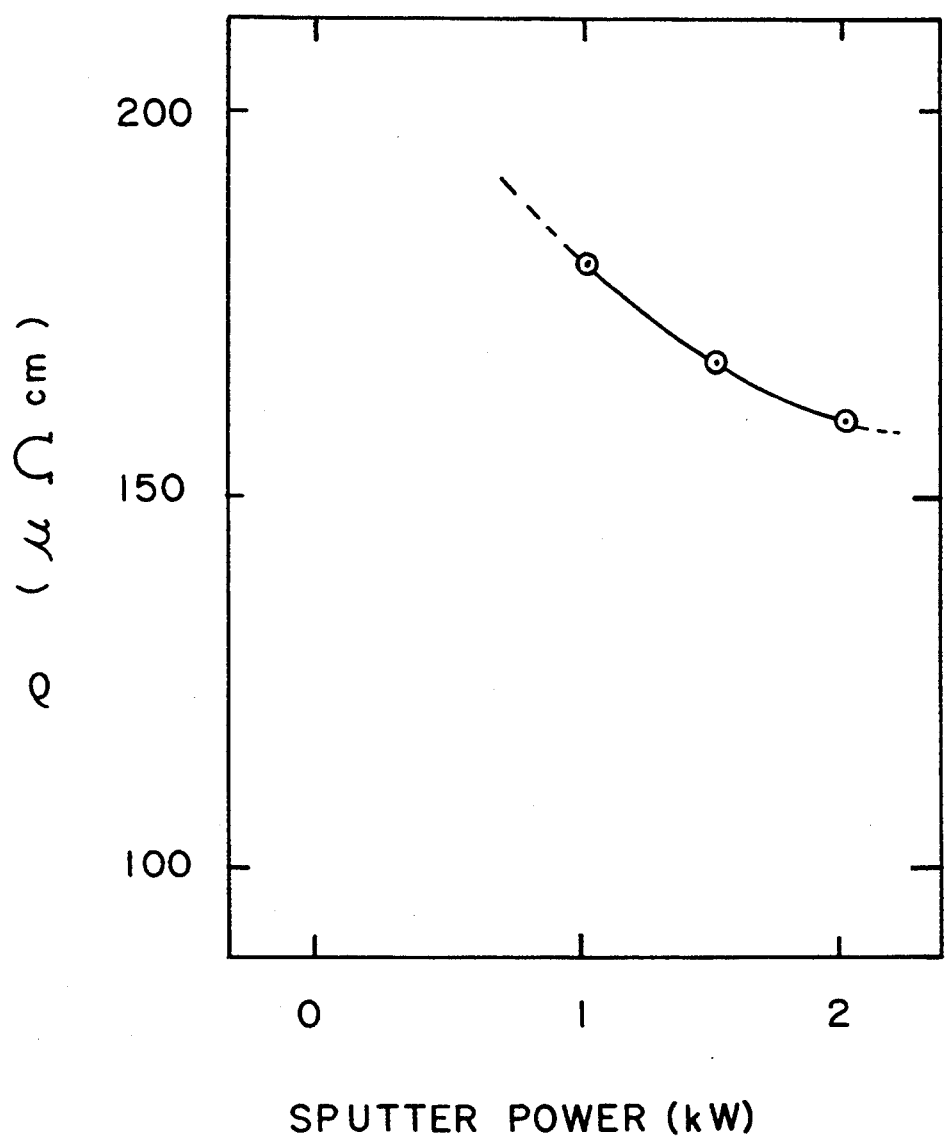
FIG. 17 is a diagram showing the sputtering power and the specific resistance of a Ta film in a β phase structure formed without being doped with nitrogen.
Figure 18:
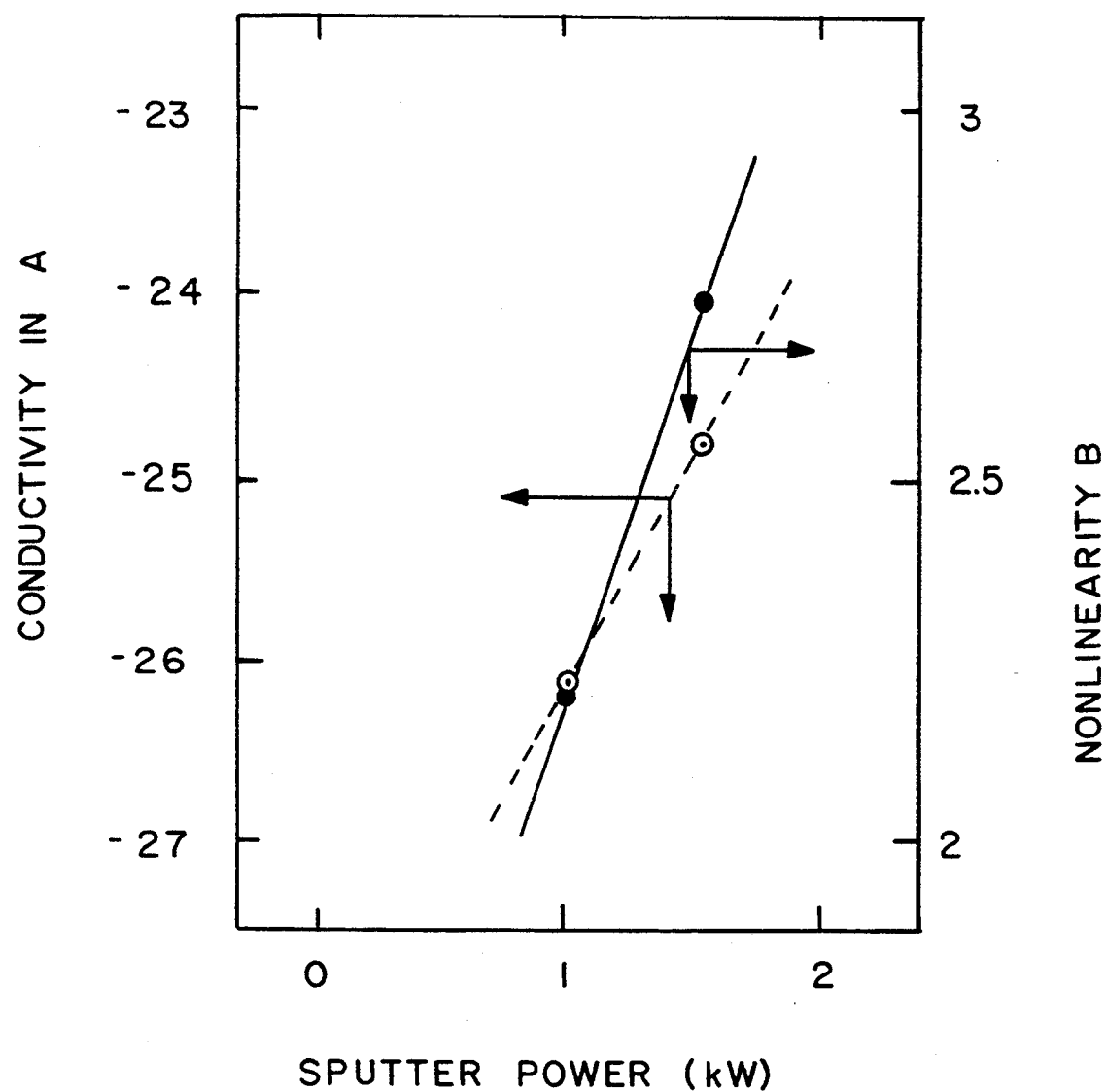
FIG. 18 is a diagram showing the relationship between the sputtering power, the conductivity, and the nonlinearity of an MIM device formed by using a β-Ta film formed without being doped with nitrogen.

FIG. 17 shows a change of a specific resistance ρ of the β-Ta film doped with no nitrogen. FIG. 18 shows Poole-Frenkel characteristics, i.e., the conductivity lnA and nonlinearity B of the MIM device using the β-Ta film doped with no nitrogen, with respect to a sputtering power.

As is understood from FIGS. 17 and 18, the specific resistance ρ of the Ta film obtained by sputtering, the conductivity lnA and the nonlinearity of the MIM device are varied by a change of the sputtering power. Such variations are caused as follows: When the sputtering rate becomes higher by an increased sputtering power, intervals in a Ta lattice in the deposited Ta film are enlarged during the formation of the Ta film, and free electrons are likely to move, making it easy for the current to flow.

In this example, the sputtering power is set at 2.6 kw. However, when the sputtering power is reduced to 1.7 kw as shown in Table 3, the resistance of the MIM device is increased and the nonlinearity B thereof is decreased. Thus, no contrast is realized by the liquid crystal display apparatus. As mentioned above, a higher sputtering power is preferred.

TABLE 3

| | Sputtering Method | Flow Rate of $N_2$ gas | DC Power | Characteristics of MIM Device | | Display Characteristics | |
|---|---|---|---|---|---|---|---|
| | | | | in A | B | Vop | Contrast ratio |
| Example | Sputtering | 5% | 2.6 kW | −30.7 | 3.34 | 20.9 | 18.0 |
| Comparative | using TaN | | 1.7 kW | −34.2 | 3.04 | — | — |
| Example | as target | 15% | 2.6 kW | — | ∼0 | 50∼ | ∼1 |
| | Reactive | 0% | 4.5 kW | −24.5 | 2.82 | — | — |
| | Sputtering | 2.9% | | −26.0 | 2.80 | 17.6 | 10.6 |
| | | 4.3% | | −26.8 | 2.87 | 28.0 | 15.4 |

Figure 19:
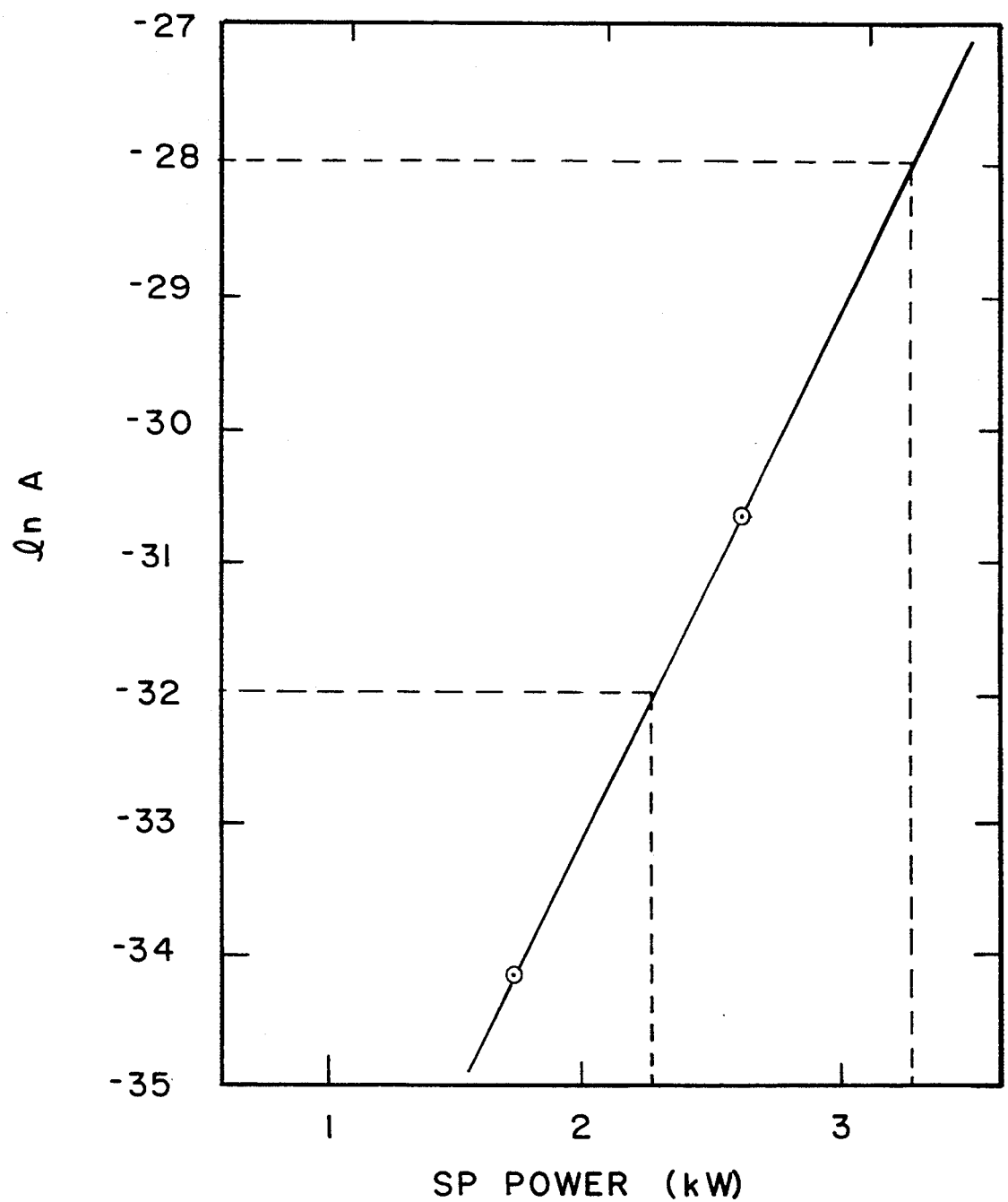
FIG. 19 is a diagram showing the relationship between the sputtering power and the conductivity of an MIM device formed with a Ta film by sputtering using sintered TaN as a target.

FIG. 19 shows the relationship between the sputtering power in a DC sputtering using a single piece of TaN sintered target and the coefficient lnA representing the conductivity of the MIM device. In general, when the coefficient lnA is a value in the range of −32 to −28, the MIM device has an excellent characteristic. FIG. 19 shows that the sputtering power should be set in the range of 2.2 kW to 3.2 kW in order that the MIM device of this example has the conductivity in the above-mentioned range. Accordingly, it is preferred that in this example, the thin Ta film is deposited with a high sputtering rate by setting the sputtering power in the range of 2.2 kW to 3.2 kW, so that the difficulty in the current flow can be prevented due to the uniform and fine structure of Ta. Further, the thin Ta film thus obtained can uniformly contain nitrogen because no $N_2$ gas is used, different from Example 1 employing the reactive sputtering.

As mentioned above, according to the present invention, an appropriate amount of nitrogen is uniformly doped in the thin Ta film used for the lower electrodes of the two-terminal nonlinear device. Accordingly, two-terminal nonlinear devices having nonlinearity as good as or better than that of the MIM device using the thin β-Ta film immediately after the fabrication thereof can be obtained. Further, an MIM device having an excellent thermal stability can be obtained. Moreover, two-terminal nonlinear devices having a uniform nonlinearity is obtained, compared with two-terminal nonlinear devices having the thin Ta film obtained by the reactive sputtering using a single piece of Ta target. Moreover, in a liquid crystal display apparatus using the two-terminal nonlinear display devices of this example as switching devices, the contrast ratio is independent of the temperature, and a high contrast and high quality display can be obtained.

Example 3

A third example of the present invention will be described.

In this example, a thin Ta film is formed by a reactive sputtering using sintered TaN target containing 5 mol % of nitrogen or less, in an atmosphere of (Ar+$N_2$) gas in which the flow rate ratio of $N_2$ gas is 4% or less, thereby forming a lower electrode of a two-terminal nonlinear device.

Figure 20:
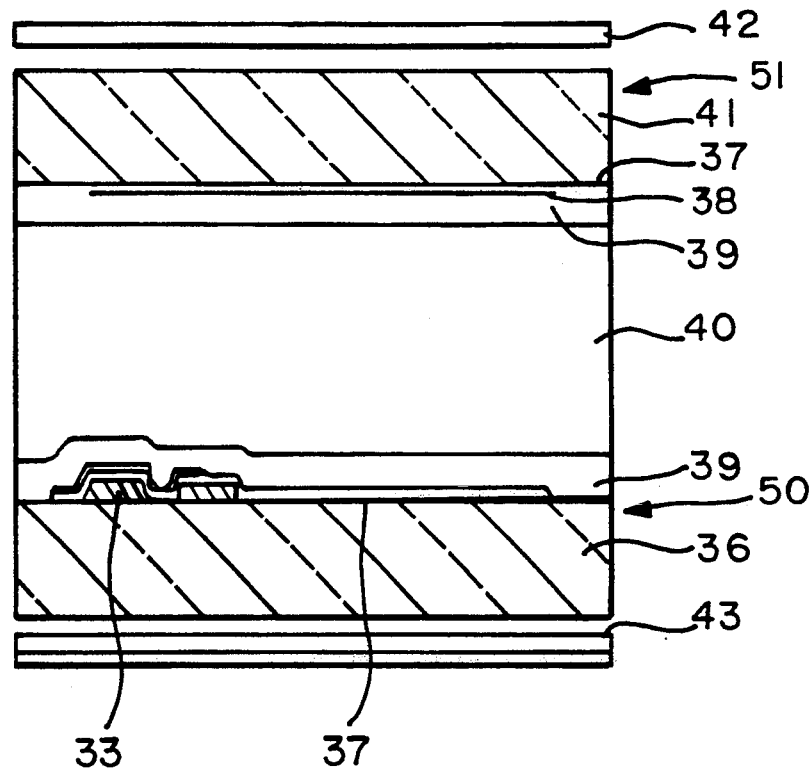
FIG. 20 is a cross-sectional view of a liquid crystal display apparatus comprising two-terminal nonlinear devices of Example 3 of the present invention.
Figure 21:
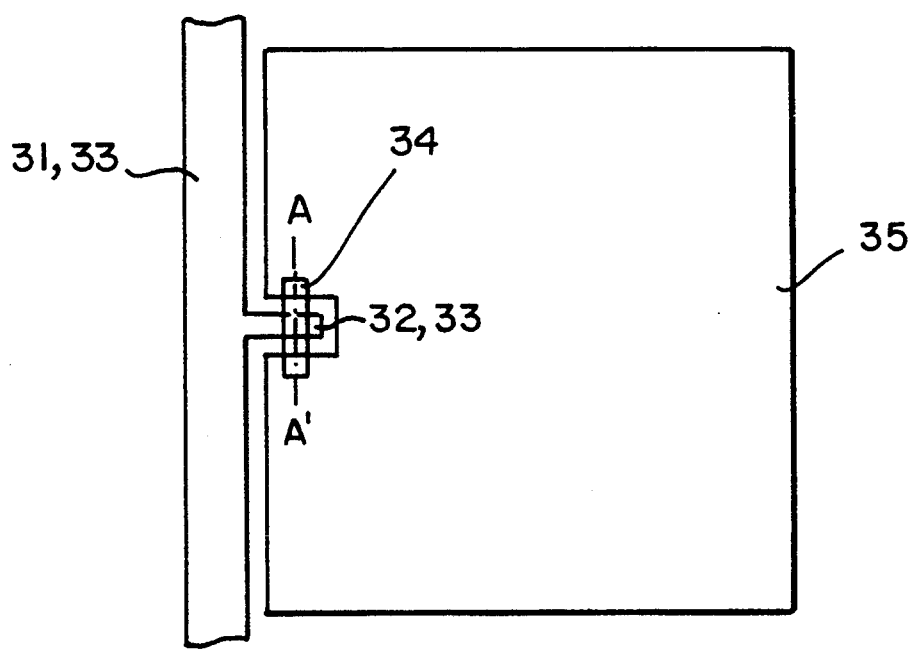
FIG. 21 is a plan view of a liquid crystal display apparatus of FIG. 20.
Figure 22:
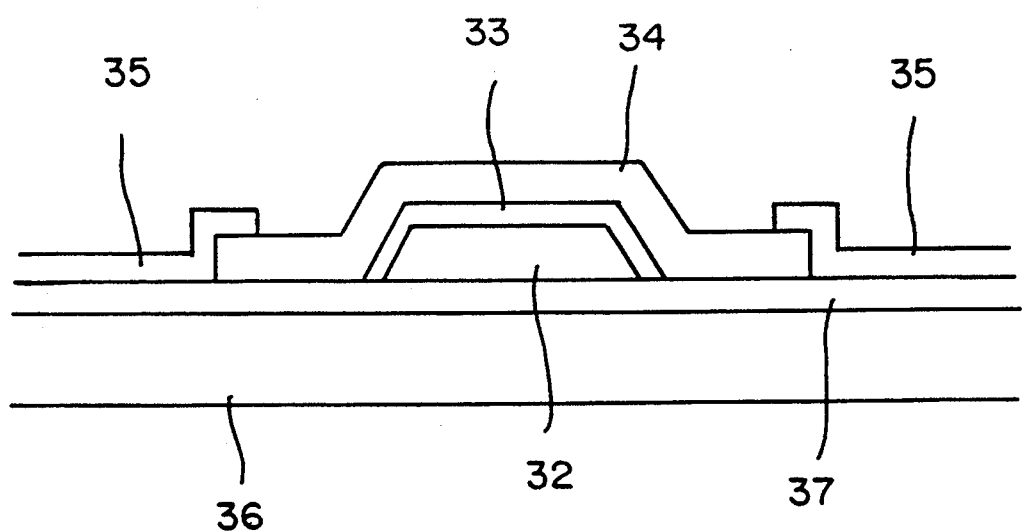
FIG. 22 is a cross-sectional view of an active matrix substrate of a liquid crystal display apparatus of FIG. 21 taken along a line A—A'.

FIG. 20 is a cross-sectional view of a liquid crystal display apparatus using the two-terminal nonlinear devices of an MIM type (hereinafter, referred to as "MIM devices") of this example as switching elements. FIG. 21 is a plan view of an active matrix substrate constituting the liquid crystal display apparatus. FIG. 22 is a cross-sectional view of FIG. 21 taken along a line A—A'. The liquid crystal display apparatus comprises the active matrix substrate 50, a counter substrate 51 and a liquid crystal layer 40 interposed therebetween.

The structure of the active matrix substrate 50 will be described with reference to FIG. 22. The active matrix substrate 50 comprises a glass substrate 36. A base coating insulator 37 is deposited almost over the glass substrate 36. On the base coating film 37, a plurality of signal lines 31 of Ta and a plurality of lower electrodes 32 branched from the signal lines 31 are formed. Insulators 33 are deposited over the signal lines 31 and lower electrodes 32, and upper electrodes 34 of Ta, Ti, Cr, Al or the like are formed thereon. The MIM device comprises one lower electrode 32, one upper electrode 34 and one insulator 33 interposed therebetween. The upper electrode 34 is electrically connected to the corresponding one of the pixel electrodes 35 of an ITO transparent conductive film or the like.

The active matrix substrate is formed as follows under the conditions that a liquid crystal cell has a reflective monochrome TN liquid crystal mode having 640×480 dots and 0.3 mm pitch; the width of each signal line 31 is 40 μm; the size of the MIM element is 6 μm×5 μm; and the ratio of the MIM element capacity to the liquid crystal capacity is approximately 1:10.

First, the base coating insulator 37 of $Ta_2O_5$ is deposited on the glass substrate 36 by sputtering so as to have a thickness of 5000 angstroms. No-alkali glass, borosilicate glass, and soda-lime glass may be used as the glass substrate 36. In this example, #7059 Fusion Pilex Glass (manufactured by Corning Japan Co., Ltd.) is used. Further, the base coating insulator 37 can be omitted;

however, thin films formed on the base coating insulator 37 can be prevented from being contaminated by the glass substrate 36, thereby obtaining further excellent characteristics of the MIM device.

Figure 23A:
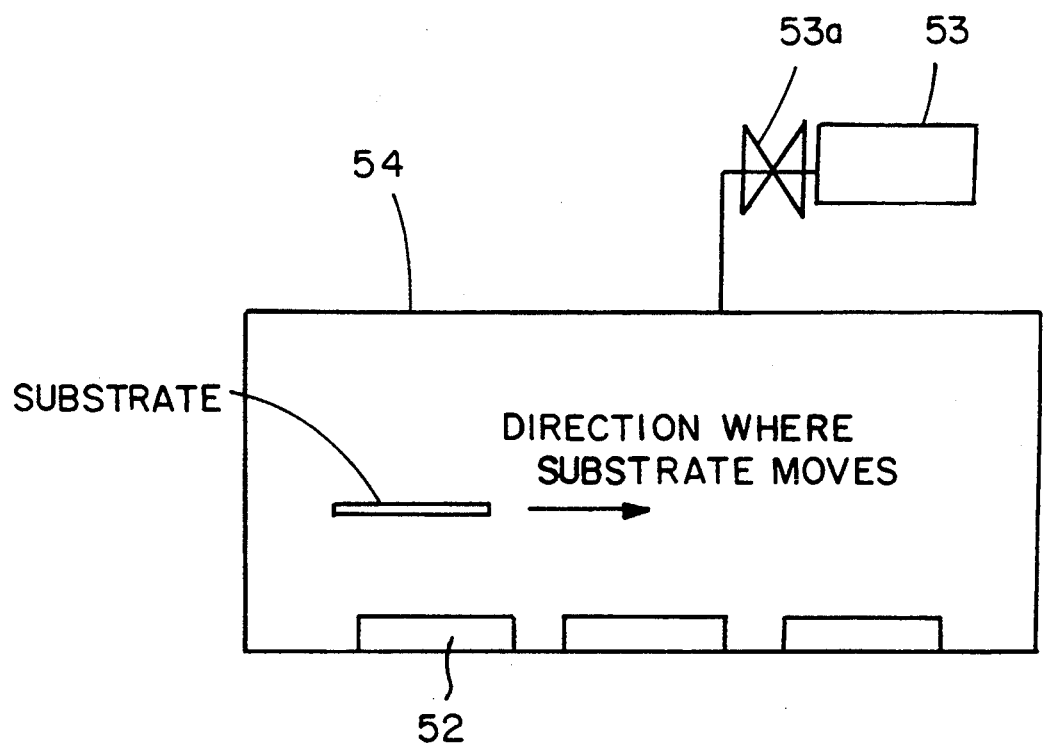
FIG. 23A is a schematic front view of an in-line sputtering apparatus.

Successively, a thin Ta film is deposited on the base coating insulator 37 by sputtering so as to have a thickness of 3000 angstroms. In this example, sputtering is conducted in an in-line sputtering apparatus (as shown in FIG. 23A) using three pieces of sintered TaN target containing 3 mol % of nitrogen in an atmosphere of (Ar and $N_2$) gas. Ar gas and $N_2$ gas are introduced into a chamber 54 of the sputtering apparatus, respectively. $N_2$ gas is reserved in a tank 53 and the flow rate thereof is adjusted by a valve 53a so that the flow rate ratio of $N_2$ gas to (Ar+$N_2$) gas is 2%, when $N_2$ gas is introduced into the chamber 54 from the tank 53. In addition, in this example, sputtering is conducted under the condition of a gas pressure in chamber 54 of 0.4 Pa; a DC power of 5.3 W/cm$^2$; a temperature and the time for heating the substrate of 100° C. and 180 seconds; a conveyance rate of the substrate of 100 mm/min; and an interval between the substrate and target 52 of 77 mm. In this case, the sputtering rate is approximately in the range of 300 to 600 angstroms/min.

The thin Ta film thus deposited is patterned into a desired shape by photolithography, to form the signal line 1 and the lower electrode 2 of the MIM device.

Figure 23B:
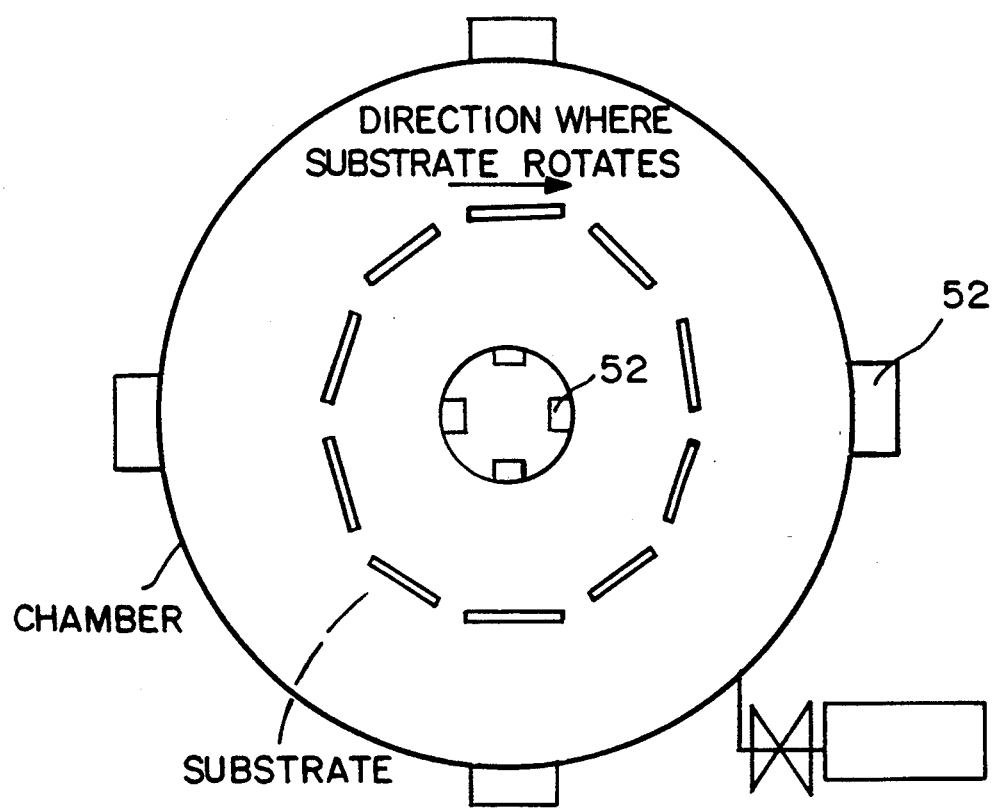
FIG. 23B is a schematic plan view of a rotary sputtering apparatus.

In addition, a thin Ta film can be formed by a rotary sputtering apparatus shown in FIG. 23B in place of the in-line sputtering apparatus. In the case of using the rotary sputtering apparatus, sputtering is conducted under the condition of the sputtering pressure in the range of $9.3 \times 10^{-2}$ to 1.3 Pa; the DC power of 5 W/cm$^2$; the temperature for heating the substrate of 240° C.; the rotation rate of 160 sec/time; an interval between the target 52 and the substrate of 200 mm. In the rotary sputtering apparatus, four pieces of target 52 are provided inside and outside the rotation area of the substrate, as shown in FIG. 23B; however, one or more pieces of target 52 can be provided only inside or outside the rotation area.

After that, an exposed portion of each of the signal line 31 and the lower electrode 32 excluding a terminal portion thereof to be connected to the external driving circuit is anodized in 1 wt % of an ammonium tartrate solution as an electrolyte, thereby forming an anodized oxide film. In this example, the anodization is conducted under the conditions that the temperature is the electrolyte of approximately 25° C.; the voltage is approximately 27 V; and the current is approximately 0.7 mA, thereby forming an anodized oxide film of $Ta_2O_5$ having a thickness of 600 angstroms.

Next, a metal thin film is deposited over the glass substrate 36 by sputtering and then patterned into a desired shape by the photolithography or the like to form the upper electrode 34. Examples of materials for the upper electrode 34 include Ta, Ti, Cr and Al. In this example, a thin film of Ti having a thickness of 4000 angstroms is patterned into a desired shape to form the upper electrodes 34. Each electrode has a rectangular shape having a length of 20 μm and a width of 6 μm.

After the fabrication process of the upper electrodes 34, a transparent conductive film of ITO or the like is deposited on the glass substrate 36 and then patterned to form the pixel electrodes 35. In this way, the active matrix substrate 50 is completed.

The counter substrate 51 is fabricated as follows:

The counter substrate also comprises a glass substrate 41. A plurality of strips of a transparent conductive film of ITO are formed at 0.3 mm pitch on the glass substrate 41 so that respective strips cross the signal lines 31 on the active matrix substrate 50 at right angles. The strips work as counter electrodes 38. The thickness of each strip is 1000 angstroms. If a color filter layer is formed on the counter substrate 51, a liquid crystal display apparatus capable of displaying color can be obtained. In addition, the active matrix substrate 50 and the counter substrate 51 can be produced in the reverse order, compared with the above-mentioned fabrication process.

An orientation film 39 is deposited over a surface of each of the active matrix substrate 50 and the counter substrate 51 bearing wirings at a temperature of approximately 200° C. After that, both of the substrates with the orientation films 39 are rubbed in a prearranged direction so as to obtain liquid crystal molecule alignments.

Next, a thermosetting sealing agent is coated onto either one of the substrates 50 and 51, and a spacer is uniformly dispersed on the other substrate. The resulting substrates are attached to each other so that the orientation films face each other and then heated at a temperature of approximately 150° to 200° C. so as to cure the sealing agent, while the substrates are pressed. The substrates are arranged so that the liquid crystal molecules will make a 90° twist going from one substrate to the other substrate.

Liquid crystal is injected between the attached substrates and the resulting substrates are sealed. In this way, the liquid crystal cell is completed.

A transmitting polarizer 42 having a transmittance of 44.5% and the degree of polarization of 96.5% is provided on a front face of the liquid crystal cell; and a reflective polarizer 43 obtained by providing an Al reflective plate on the same transmitting polarizer as the transmitting polarizer 42 is provided on a back face, thereby completing a liquid crystal display apparatus.

In this example, sintered TaN target containing nitrogen is used for deposition of a thin Ta film by sputtering. Thus, the flow rate ratio of $N_2$ gas to (Ar+$N_2$) gas can be maintained below approximately 4%, with which the flow rate of $N_2$ gas cannot be easily regulated. Accordingly, it is possible that $N_2$ gas is uniformly introduced into the sputtering chamber, whereby the amount of nitrogen in the sputtering apparatus can be uniformly regulated. Due to this, the amount of nitrogen taken into the thin Ta film can be made uniform. As a result, unevenness in the thickness of the insulator obtained by the anodization of the thin Ta film can be prevented, whereby unevenness in the nonlinearity among the MIM devices can be greatly decreased.

Figure 24:
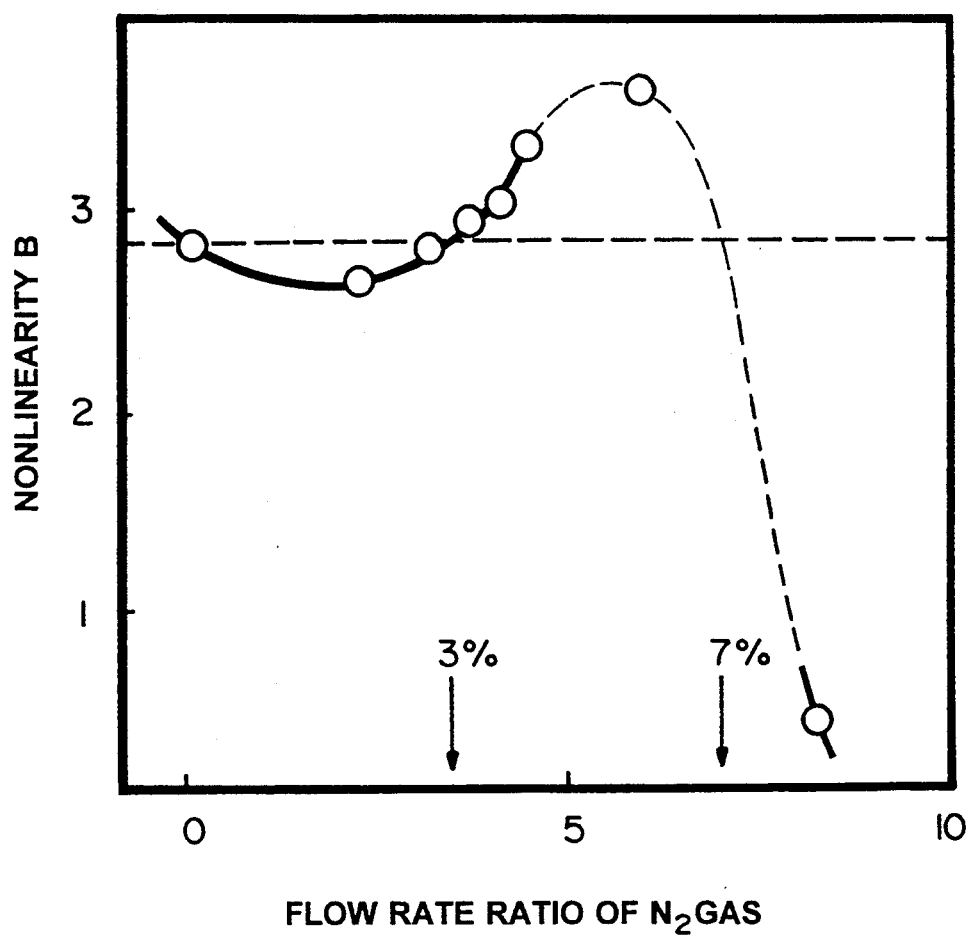
FIG. 24 is a diagram showing the relationship between the flow rate ratio of $N_2$ gas to $(Ar+N_2)$ gas and the nonlinearity B of a two-terminal nonlinear device of Example 3.

Further, as is understood from FIG. 24, in the case where a thin Ta film is formed by the reactive sputtering, in order to obtain the same degree of the nonlinearity of the MIM device as that of the MIM device using the β-Ta film as the lower electrode, the flow rate ratio of $N_2$ gas to (Ar+$N_2$) gas should be set in the range of 3 to 7%. In this example, nitrogen can be obtained from both sintered TaN target and $N_2$ gas in an atmosphere of (Ar+$N_2$) gas. Thus, a sufficient amount of nitrogen can be taken into the thin Ta film so as to prevent the deterioration of the nonlinearity of the MIM device caused by the heat treatment while fabricating the liquid crystal cell. Further, sintered TaN target containing a smaller amount of nitrogen can be used in this example, so that intervals in a Ta lattice of the deposited thin Ta film are enlarged. Therefore, the nonlinearity of the two-terminal nonlinear device as excellent as or more excellent than that of the MIM device using the β-Ta film for the lower electrodes can be obtained.

In this example, sputtering is conducted using several pieces of TaN target in the sputtering apparatus shown in FIGS. 23A and 23B. By using several pieces of TaN target, a substrate on which the thin Ta film is deposited passes regions where the substrate faces pieces of TaN target 52 and regions where the substrate does not face pieces of TaN target 52, alternately. Accordingly, the thin Ta film has the same structure as that of Example 1 (see FIG. 3) in which the poor portions (containing a small amount of nitrogen) and the rich portions (containing a large amount of nitrogen) are alternately deposited from the side of glass substrate 36. An insulator formed by the anodization of the thin Ta film may have such a structure to some extent. That is, the insulator also has the poor portions and rich portions alternately deposited therein. Due to the rich portions existing in the insulator, the nonlinearity of the MIM device can easily be thermally stabilized; and due to the poor portions existing in the insulator, the current can easily flow. Further, the MIM device has a satisfactory symmetrical curve of a current-voltage characteristic as shown in FIG. 8 (in which the reactive sputtering is conducted using three pieces of target).

Figure 25A:
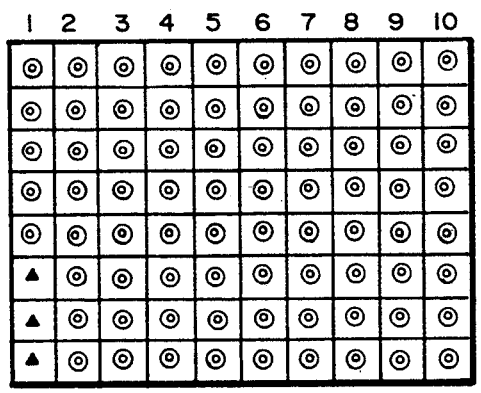
FIGS. 25A to 25D show diagrams showing the unevenness in a sheet resistivity of a thin Ta film in each of Example 3 and Comparative Examples 1 to 3.
Figure 25B:
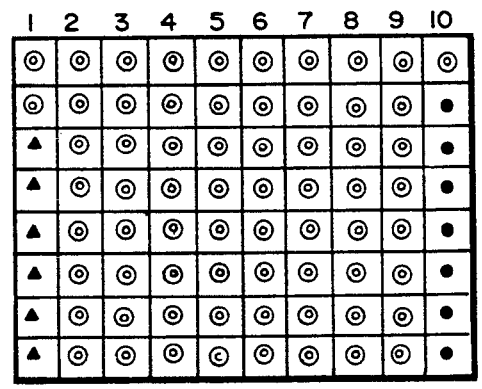
Figure 25C:
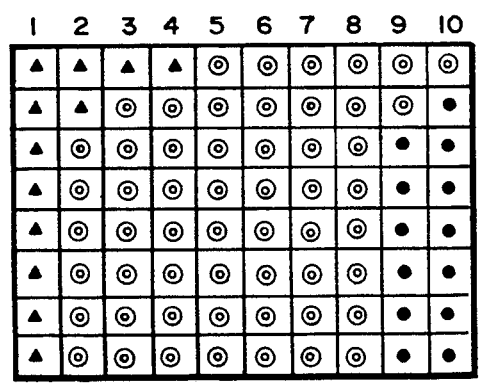
Figure 25D:
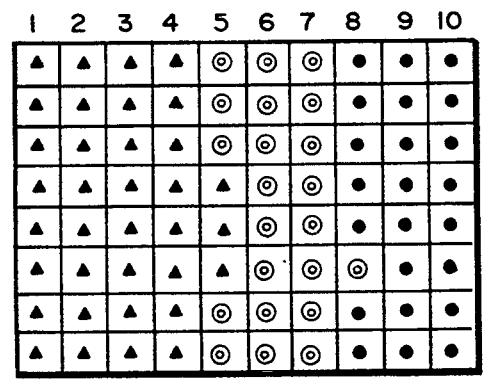

FIG. 25A shows the unevenness in the sheet resistivity of the thin Ta film of this example. The thin Ta film is formed under the conditions that the amount of nitrogen contained in sintered TaN target is 3 mol % and the flow rate ratio of $N_2$ gas to $(Ar+N_2)$ gas is 2%. FIG. 25B shows Comparative Example 3 in which a thin Ta film is formed by sputtering using sintered TaN target containing 5 mol % of nitrogen in an atmosphere of Ar gas. FIGS. 25C and 25D show Comparative Examples 4 and 5, respectively. In Comparative Example 4, a thin Ta film is formed by the reactive sputtering using Ta target having the purity of 99.99% in an atmosphere of $(Ar+N_2)$ gas in which the flow rate ratio of $N_2$ gas is 2.9%. In Comparative Example 5, a thin Ta film is deposited in the same manner as in Comparative Example 4 except that the flow rate ratio of $N_2$ gas to $(Ar+N_2)$ gas is 4.3%.

As is understood from FIGS. 25A to 25D, the thin Ta films obtained in this example have a more uniform sheet resistivity, compared with the thin Ta films in Comparative Examples 3, 4 and 5. The thin Ta films such as those of this example are anodized, whereby insulators having a uniform thickness are formed. Accordingly, the unevenness in the nonlinearity of the MIM device is greatly decreased in this example.

Figure 26:
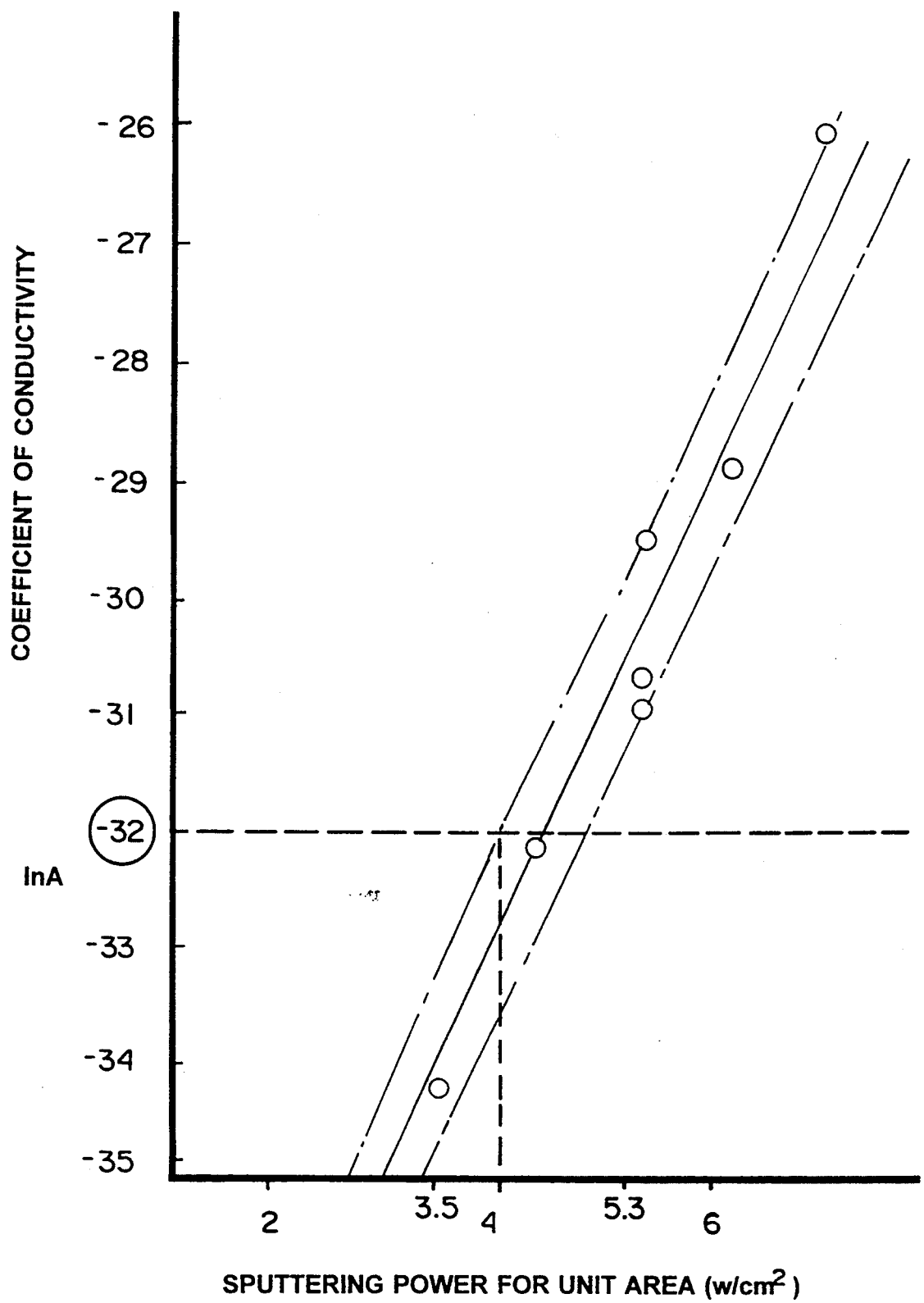
FIG. 26 is a diagram showing the relationship between the sputtering power for a unit area and the conductivity lnA of a two-terminal nonlinear device of Example 3.

FIG. 26 shows the relationship between the sputtering power for a unit area and the coefficient of the conductivity (lnA). As is understood from FIG. 26, when lnA is smaller than −32, the symmetrical curve of a current-voltage characteristic is not obtained, which is not preferred in view of the characteristic of the MIM device. Thus, it is preferred that the sputtering power is set at 4 W/cm² or more. However, when lnA is made too large, the sputtering power becomes too large, so that the sputtering apparatus will be damaged. On the contrary, since the coefficient B represents the nonlinearity of the MIM device of this example, a larger voltage ratio ($V_{ON}/V_{OFF}$) in the vicinity of the threshold voltage can be obtained by setting B larger, whereby high contrast of a liquid crystal display apparatus can be realized.

Table 4 shows the nonlinearity of the MIM device of this example and the contrast ratio of a liquid crystal display apparatus using the MIM devices of this example. In this example, sputtering is conducted using sintered TaN target in an atmosphere of $(Ar+N_2)$ gas to form a Ta thin film. Further, in Example 3-1, an in-line sputtering apparatus is used as a sputtering apparatus; and in Example 3-2, a rotary sputtering apparatus is used. In Comparative Example 6, sputtering is conducted using sintered TaN target in an atmosphere of Ar gas; in Comparative Examples 7 and 8, sputtering is conducted using Ta target in an atmosphere of $(Ar+N_2)$ gas; and in Comparative Example 9, sputtering is conducted using pure Ta target in an atmosphere of Ar gas for forming a β-Ta film.

TABLE 4

|  | Sputtering Method | Amount of Nitrogen in target (mol %) | Amount of $N_2$ gas in $(Ar + N_2)$ gas (%) | Sputtering Power (w/cm²) | Characteristics of MIM Device | | Contrast ratio |
| --- | --- | --- | --- | --- | --- | --- | --- |
|  |  |  |  |  | in A | B |  |
| Example 1 | Mixing Technique (conveyance in a series) | 3 | 2 | 5.3 | −31.0 | 3.2 | 20 |
| Example 2 | Mixing Technique (conveyance in a rotation) | 5 | 2 | 5.0 | −32.5 | 2.9 | 15 |
| Comparative Example 6 | Sputtering TaN as target | 5 | 0 | 5.3 | −30.7 | 3.4 | 18 |
| Comparative Example 7 | Reactive Sputtering | 0 | 2.9 | 6.8 | −26.0 | 2.8 | 11 |
| Comparative Example 8 | Reactive Sputtering | 0 | 4.3 | 6.8 | −26.8 | 2.9 | 15 |
| Comparative Example 9 |  | 0 | 0 | 6.8 | −24.5 | 2.8 | — |

As is understood from Table 4, the MIM device of this example has the conductivity (lnA) smaller than that of any other Comparative Examples 6 to 9. Namely, the MIM device of this example has a small leak current. Further, the value of the coefficient B representing the nonlinearity of the MIM device of this example is close to that of the MIM device of Comparative Example 9. Therefore, the MIM device of this example has the nonlinearity as good as that of the MIM device comprising an insulator obtained by the anodization of the β-Ta film.

Figure 27:
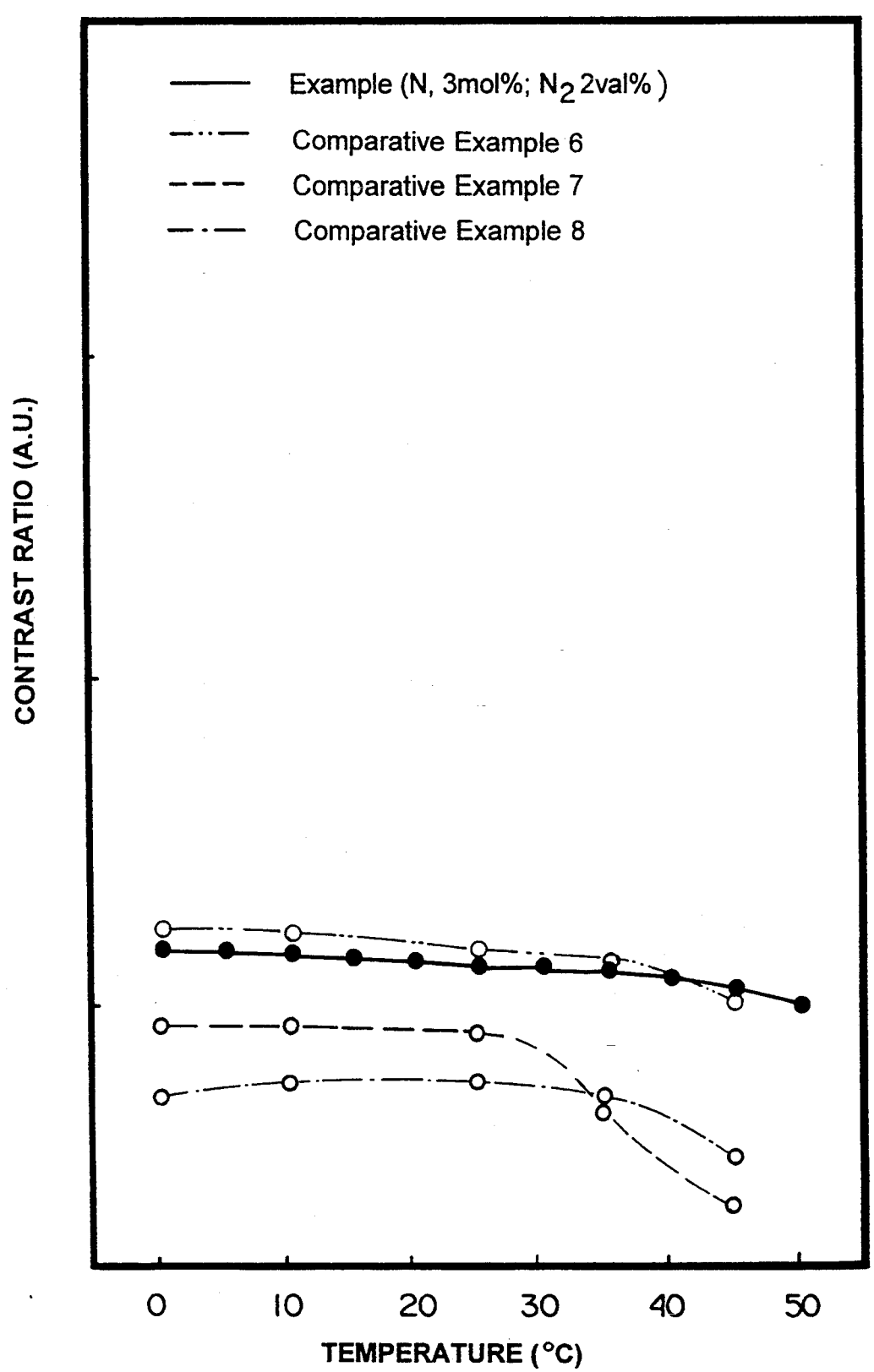
FIG. 27 is a diagram showing the temperature dependence of the contrast ratio of a liquid crystal display apparatus having two-terminal nonlinear devices of Example 3.

FIG. 27 shows the temperature dependence of the contrast ratio in a liquid crystal display apparatus using the MIM devices of this example in a solid line. Further, a two-dot dash line, a broken line and a dash-dot line represent the contrast ratio of the MIM device of Comparative Examples 6, 7 and 8, respectively. As is understood from FIG. 27, the contrast ratio of this example is independent of bad influence by temperature and is therefore excellent.

In this example, pieces of sintered TaN target containing 3 mol % of nitrogen are used. However, the amount of nitrogen in the sintered TaN target is not limited to 3 mol %. It is preferred that the amount of nitrogen in the sintered TaN target is 5 mol % or less, and 3 mol % or less is more preferred. Further, $N_2$ gas is introduced into the chamber 54 so that the flow rate ratio of $N_2$ gas to $(Ar+N_2)$ gas is 2%. However, the flow ratio of $N_2$ gas to $(Ar+N_2)$ gas is not limited to 2%. It is preferred that the flow rate ratio of $N_2$ gas is 4% or less, and 2% or less is more preferred.

According to this example, a thin Ta film can be formed by using nitrogen contained in sintered TaN target and in an $(Ar+N_2)$ gas. Thus, even though the flow rate ratio of $N_2$ gas is set below the range with which the flow rate of $N_2$ gas cannot be regulated, a sufficient amount of nitrogen can be taken into the deposited thin Ta film so as to decrease the unevenness in the nonlinearity of the MIM device. Further, it is possible to obtain a sufficient amount of nitrogen so as to prevent the deterioration of the nonlinearity of the MIM device due to the heat treatment. Accordingly, MIM devices whose nonlinearity is less uneven and more thermally stable can be more reliably obtained. Further, in this example, since sputtering is conducted by using sintered TaN target in an atmosphere of $(Ar+N_2)$ gas, intervals in the Ta lattice of the deposited thin Ta film can be enlarged, compared with Example 2 in which sputtering is conducted using sintered TaN as a target in an atmosphere of Ar gas. Due to this, the current can easily flow in the insulator formed by the anodization of the Ta thin film. Moreover, in a liquid crystal apparatus using the MIM devices of this example as switching elements, a display having high contrast and high quality, being independent of the temperature can be obtained.

Example 4

A fourth example of the present invention will be described.

In this example, MIM devices having an uniform and thermally stable nonlinearity will be formed. When such MIM devices are used as switching elements in a liquid crystal display apparatus, an occurrence of a residual image on a display can be prevented.

Figure 28:
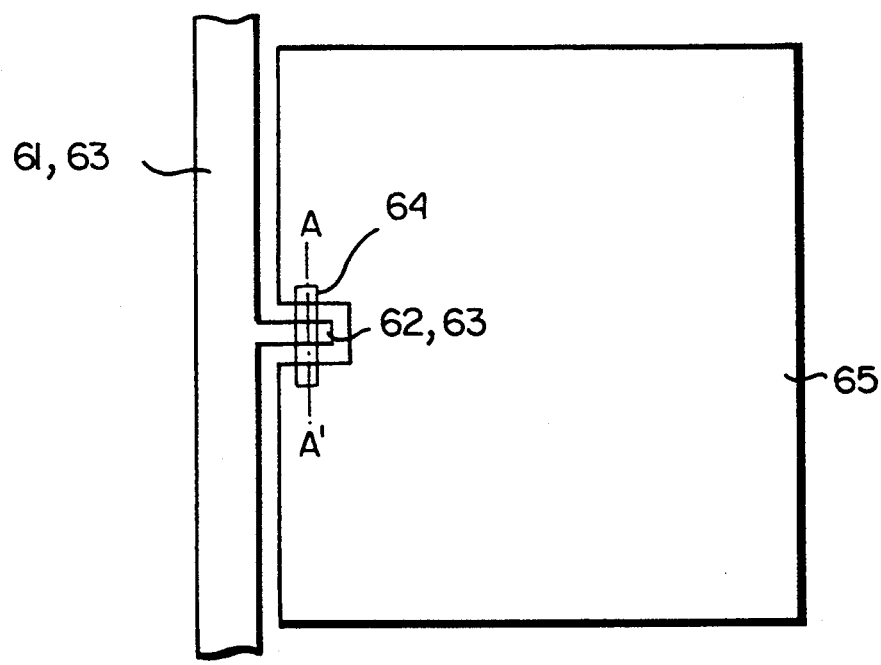
FIG. 28 is a plan view of an active matrix substrate of a liquid crystal display apparatus comprising two-terminal nonlinear devices of Example 4 of the present invention.
Figure 29:
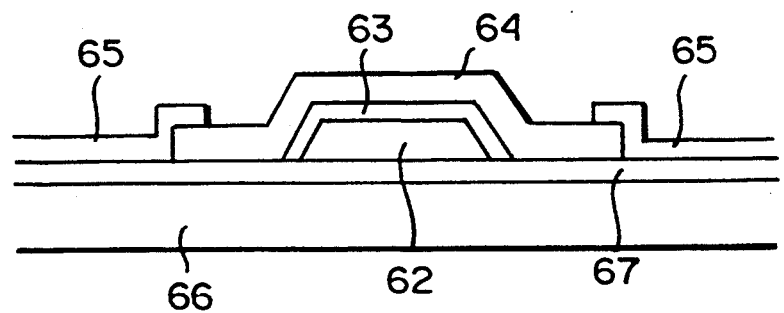
FIG. 29 is a cross-sectional view of a liquid crystal display apparatus of FIG. 28.

FIG. 28 is a plan view showing an active matrix substrate on which the MIM devices are formed. FIG. 29 is a cross-sectional view taken along a line A—A'. FIG. 28 shows the active matrix substrate for one pixel.

The structure of the active matrix substrate will be described with reference to FIGS. 28 and 29. The active matrix substrate comprises a glass substrate 66. A base coating insulator 67 is deposited almost over the glass substrate 66. On the base coating insulator 67, a plurality of signal lines 61 of Ta and a plurality of lower electrodes 62 branched from the signal lines 61 are formed. Insulators 63 are formed over the signal lines 61 and lower electrodes 62, and upper electrodes 64 of Ta, Ti, Cr, Al or the like are formed thereon. The MIM device comprises one lower electrode 62, one upper electrode 64 and one insulator 63 interposed therebetween. The upper electrode 64 is electrically connected to the corresponding one of the pixel electrodes 65 of an ITO transparent conductive film or the like.

The active matrix substrate is fabricated as follows under the conditions that a liquid crystal cell has a reflective monochrome TN liquid crystal mode having 640×480 dots and 0.3 mm pitch; the width of each signal line 61 is 40 μm; the size of the MIM device is 6 μm×5 μm; and the ratio of the MIM device capacity to the liquid crystal capacity is approximately 1:10.

First, the base coating insulator 67 of $Ta_2O_5$ is deposited on the glass substrate 66 by sputtering so as to have a thickness of 5000 angstroms. No-alkali glass, borosilicate glass and soda-lime glass may be used as the glass substrate 66. In this example, #7059 Fusion Pilex Glass (manufactured by Corning Japan Co., Ltd.) is used. Further, the base coating insulator 67 can be omitted; however, thin films formed on the base coating film 67 can be prevented from being contaminated from the glass substrate 66, thereby obtaining further excellent characteristics of a two-terminal nonlinear device of an MIM type (hereinafter, referred to as "an MIM device").

Successively, the thin Ta film is deposited on the glass substrate 66 by a reactive sputtering so as to have a thickness of 3000 to 3500 angstroms. In this case, three pieces of target of Ta with a purity of 99.99% are aligned in series in the direction where the substrate 66 is conveyed. Moreover, argon (Ar) gas and nitrogen ($N_2$) gas are used as reactive gas. The flow rate ratio of $N_2$ gas to $(Ar+N_2)$ gas is set at 2.2%, 2.9%, 3.6%, 4.3% and 8.3% for sputtering. Further, the thicknesses of poor portions (containing a small amount of nitrogen) and rich portions (containing a large amount of nitrogen) of the thin Ta film can be changed by appropriately adjusting intervals between the three pieces of Ta target and conditions for sputtering such as the sputtering power and the conveyance rate of the glass substrate 66. In this example, sputtering is conducted under the conditions that each target has a size of 5 inches×16 inches; each interval between the pieces of target is 10 cm; the sputtering power is 3.5 to 4.5 kW (current: 8.5 A, voltage: 410 to 530 V), the conveyance rate of the substrate is 460 mm/min; and the temperature for heating the substrate is 100° C.

Next, the deposited thin Ta film is patterned into a desired shape by photolithography so as to form the signal line 61 and the lower electrode 62. After that, an exposed portion of each of the signal line 61 and the lower electrode 62, excluding a terminal portion thereof to be connected to the external driving circuit, is anodized in 1 wt % of ammonium tartrate, thereby forming an anodized oxide film. In this example, the anodization is conducted under the conditions that the temperature of an electrolyte, i.e., 1 wt % of ammonium tartrate, a voltage and a current are approximately 25° C., 27 V and 0.7 mA, respectively, thereby obtaining the anodized oxide film of $Ta_2O_5$ with a thickness of 600 angstroms.

Examples of the electrolyte include citric acid, phosphoric acid and ammonium borate, as well as ammonium tartrate. Table 5 shows the symmetrical curve of a current-voltage characteristic of the MIM device having the insulator formed by the anodization using such electrolytes. As is understood from Table 5, the MIM device having the anodized oxide film formed in a solution containing an ammonium group, i.e., ammonium borate or ammonium tartrate, has an excellent current-voltage characteristic curve. The best current-voltage characteristic curve can be obtained by using 1 wt % of ammonium tartrate, which can be applied to Examples 1 to 3. Namely, an excellent current-voltage characteristic curve can be obtained by using 1 wt % of ammonium tartrate in Examples 1 to 3 mentioned above.

TABLE 5

| Material of Electrolyte | Used Electrolyte | Symmetric Curve of I-V characteristic |
| --- | --- | --- |
| Citrate | 0.1 to 3.0 wt % of Citric Acid | X |
| Phosphate | 0.1 to 3.0 wt % of Phosphoric Acid | X |
| Borate | 0.5 to 3.0 wt % of Ammonium Borate | △ |
| Tartrate | 0.5 to 3.0 wt % of Ammonium Tartrate | ○ |

Next, a metal thin film is deposited over the glass substrate 66 bearing the anodized oxide film and then patterned to form the upper electrode 64. Examples of materials for the upper electrode 64 include Ta, Ti, Cr and Al. In this example, a thin film of Ti is sputtered so as to have a thickness of 4000 angstroms and then patterned by the photolithography into a desired shape to form the upper electrodes 64. Each upper electrode 64 has a rectangular shape having a length of 20 μm and a width of 6 μm. In this way, the MIM device comprising one lower electrode 62, one upper electrode 64 and one anodized oxide film 63 as the insulator interposed therebetween is completed.

Further, a transparent conductive film of ITO is deposited over the glass substrate 66 and then patterned to form the pixel electrode 65. In this way, the active matrix substrate is completed.

The active matrix substrate is attached to a counter substrate, constituting a liquid crystal cell. The counter substrate also comprises a substrate, on which a plurality of strips of a transparent conductive film are formed so that respective strips cross the signal lines 61 formed on the active matrix substrate at right angles. The strips of the transparent conductive film work as counter electrodes. In this example, the strips with a thickness of 1000 angstroms are formed at 0.3 mm pitch. In addition, if a color filter layer is formed on the counter substrate, a liquid crystal display apparatus capable of displaying color can be obtained.

The above-mentioned cell is fabricated as follows:

First, an orientation film is deposited on a surface of each of the active matrix substrate and the counter substrate at a temperature of approximately 200° C. Then, both of the substrates with the orientation films are rubbed in a prearranged direction so as to obtain liquid crystal alignments.

Next, a sealing agent is coated onto one substrate and a spacer is uniformly dispersed on the other substrate. In this example, a thermosetting agent is used as the sealing agent. The resulting substrates are attached to each other so that respective surfaces thereof with wirings face each other and then heated at a temperature of approximately 150° to 200° C. to cure the sealing agent while the substrates are pressed. Liquid crystal is injected between the substrates and the resulting substrates are sealed. The substrates are arranged so that the liquid crystal molecules will make a 90° twist going from one substrate to the other substrate. In this way, the liquid crystal cell is fabricated.

A transmitting polarizer having a transmittance of 44.5% and a degree of polarization of 96.5% is provided on a front face of the liquid crystal cell; and a reflective polarizer obtained by providing an Al reflective plate on the same polarizer as the transmitting polarizer is provided on a back face thereof, thereby fabricating a liquid crystal display device.

Figure 30:
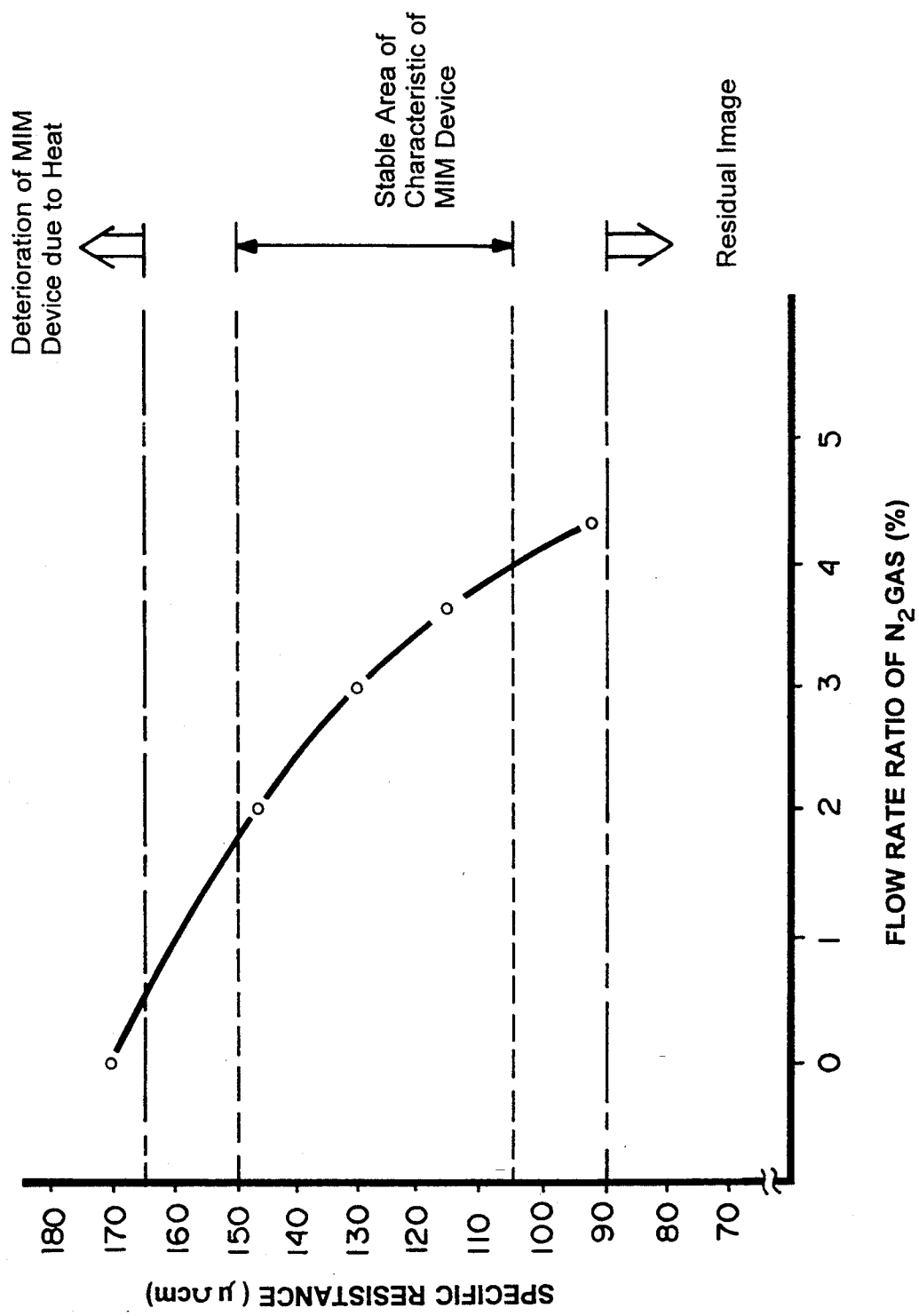
FIG. 30 is a diagram showing the relationship between the flow rate ratio of $N_2$ gas to $(Ar+N_2)$ gas and the specific resistance of a thin Ta film formed by a reactive sputtering using three pieces of Ta target.

FIG. 30 is a diagram showing the relationship between the flow rate ratio of $N_2$ gas and a specific resistance of the thin Ta film formed by the reactive sputtering in an atmosphere of $(Ar+N_2)$ gas in the same way as the above. FIG. 30 also shows the relationship between a specific resistance of a thin Ta film and the lighting evaluation of a liquid crystal cell using the MIM devices obtained by using the thin Ta film. As is understood from FIG. 30, a residual image occurs on a display of the liquid crystal display apparatus using the MIM devices when the specific resistance of the thin Ta film is set at 90 μΩcm or less (in this case, a sheet resistivity is 2.73 Ω/□ or less). Further, the nonlinearity of the MIM device is deteriorated by heat when the specific resistance is set at 165 μΩcm or more (sheet resistivity: 5.00 Ω/□ or more). As shown by a broken line in FIG. 30, a stable nonlinearity of the MIM device can be obtained, when the specific resistance is set in the range of 105 μΩcm to 150 μΩcm (sheet resistivity: in the range of 3.18 Ω/□ to 4.55 Ω/□). Accordingly, the deterioration of the nonlinearity caused by heat and the occurrence of the residual image can be prevented by setting the specific resistance in the range of 90 μΩcm to 165 μΩcm (sheet resistivity: in the range of 2.73 Ω/□ to 5.00 Ω/□) and more preferably in the range of 105 μΩcm to 150 μΩcm (sheet resistivity: in the range 3.18 Ω/□ to 4.55 Ω/□). In addition, in the case where the flow rate ratio of $N_2$ gas to $(Ar+N_2)$ is 8.3%, the specific resistance of the thin Ta film becomes approximately 82.5 μΩcm (sheet resistivity: 2.48 Ω/□). In this case, the occurrence of the residual image on the display is frequently observed.

In this example, the thin Ta film is deposited by the reactive sputtering using three pieces of target with the purity of 99.99% to form the signal line 61 and lower electrode 62; however, the thin Ta film is deposited by sputtering using sintered TaN as a target. Hereinafter, Modified Example of this example in which the thin Ta film is deposited by using sintered TaN as a target will be described.

The active matrix substrate of Modified Example is fabricated as follows:

First, the base coating insulator 67 is deposited on the glass substrate 66, and a thin Ta film is deposited thereon so as to have a thickness in the range of 3000 to 3500 angstroms. In this case, sintered TaN containing 3 mol %, 5 mol %, 7 mol % and 15 mol % of nitrogen is used as a sputtering target. Only Ar gas is used as sputter gas. Sputtering is conducted in an in-line sputter apparatus under the conditions that the gas pressure, DC power (the sputtering power for unit area of each target), temperature and the time for heating the substrate, the conveyance rate of the substrate, and each interval between the substrate and the target are 0.4 Pa, 5.3 W/cm2, 100° C., 180 seconds, 100 mm/min and 77 mm, respectively. In this case, the sputtering rate is approximately 300 to 600 angstroms/min.

Figure 31:
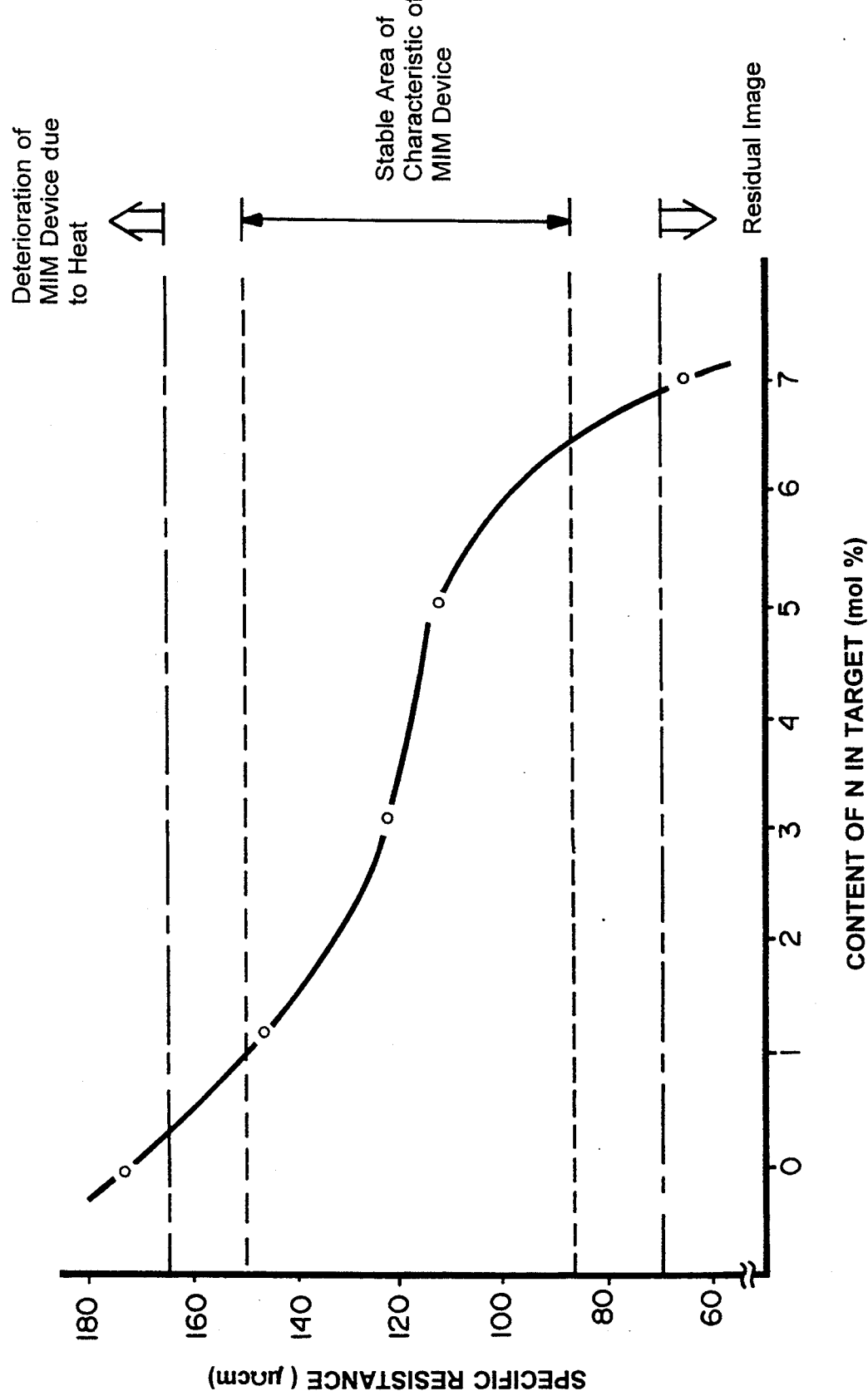
FIG. 31 is a diagram showing the relationship between the amount of nitrogen contained in sintered TaN and the specific resistance of a thin Ta film formed using sintered TaN as a target.

FIG. 31 shows the relationship between a specific resistance of the thin Ta film and the amount of nitrogen contained in sintered TaN as a target, together with the lighting evaluation of the liquid crystal display apparatus using the MIM devices obtained by using the Ta thin film. The amount of nitrogen in sintered TaN is varied at 0 mol %, 3 mol %, 7 mol % and 15 mol %.

As is understood from FIG. 31, a residual image occurs on a display of the liquid crystal display apparatus when the specific resistance of the thin Ta film is set at 70 $\mu\Omega$cm or less (sheet resistivity: 2.12 $\Omega/\square$ or less). Further, the deterioration of the nonlinearity of the MIM device caused by heat occurs when the specific resistance is set at 165 $\mu\Omega$cm or more (sheet resistivity: 5.00 $\Omega/\square$ or more). As shown by a broken line in FIG. 30, a stable nonlinearity of the MIM device can be obtained when the specific resistance is set in the range of 85 $\mu\Omega$cm to 150 $\mu\Omega$cm (sheet resistivity: in the range of 2.58 $\Omega/\square$ to 4.55 $\Omega/\square$). Accordingly, the deterioration of the nonlinearity caused by heat and the occurrence of the residual image can be prevented by setting the specific resistance in the range of 70 $\mu\Omega$cm to 165 $\mu\Omega$cm (sheet resistivity: in the range of 2.12 $\Omega/\square$ to 5.00 $\Omega/\square$) and more preferably in the range of 85 $\mu\Omega$cm to 150 $\mu\Omega$cm (sheet resistivity: 2.58 $\Omega/\square$ to 4.55 $\Omega/\square$).

As is understood from FIGS. 30 and 31, the specific resistance of the thin Ta film causing the occurrence of the residual image and the deterioration of the nonlinearity of the MIM device due to heat is slightly different between in the case where the reactive sputtering is conducted using $N_2$ gas and in the case where the sputtering is conducted using sintered TaN as a target. This is because the sputtering conditions and the intervals in the Ta lattice of the deposited thin Ta film are slightly different between the two types of sputterings.

In this example and Modified Example thereof, the lower electrodes are formed by the reactive sputtering using $N_2$ gas or by sputtering using sintered TaN as a target; however, the thin Ta film can be formed by the reactive sputtering using sintered TaN as a target in an atmosphere of (Ar+$N_2$) gas.

Figure 32:
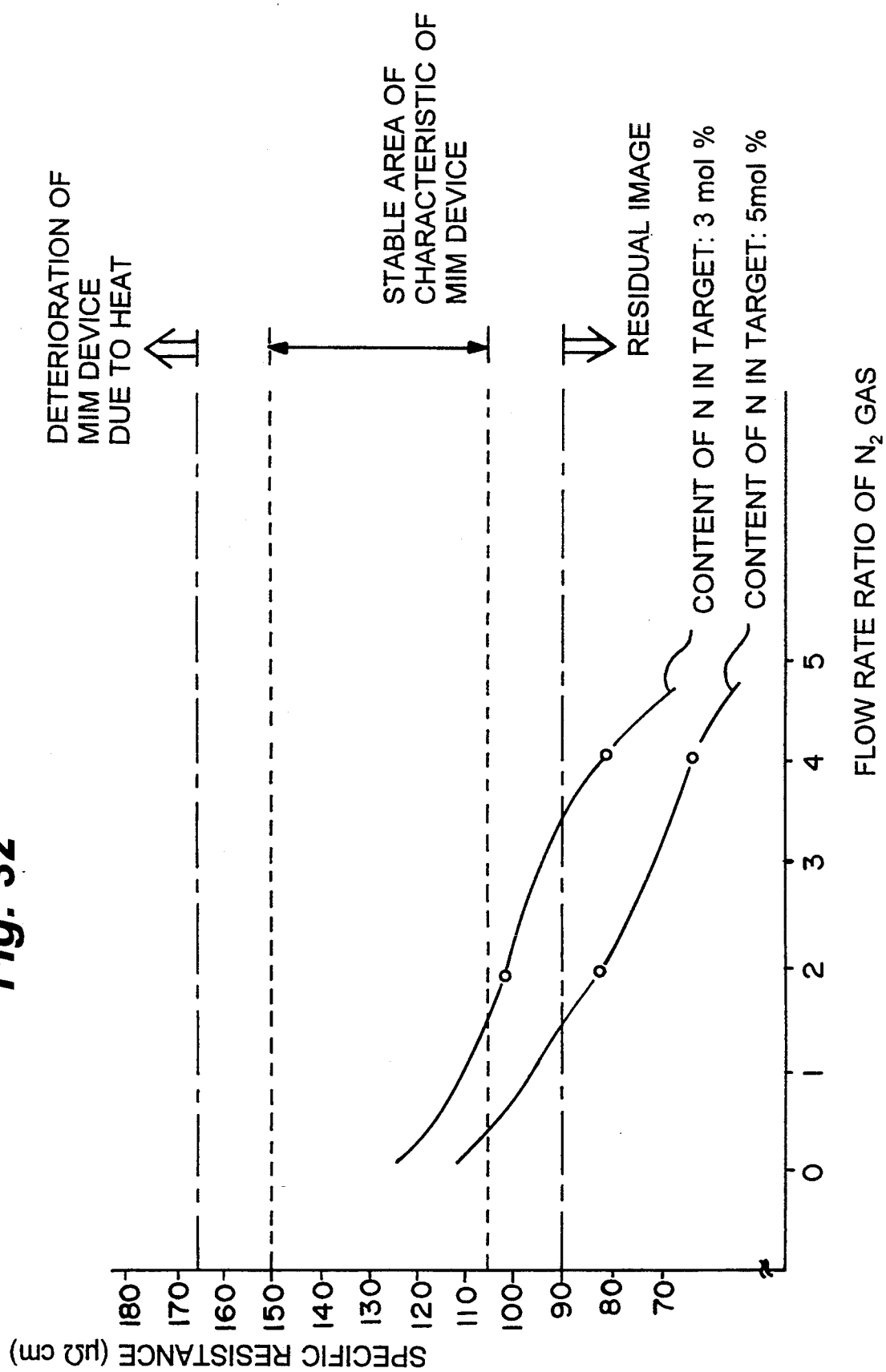
FIG. 32 is a diagram showing the relationship between the flow rate ratio of $N_2$ gas to $(Ar+N_2)$ gas and the specific resistance of a thin Ta film formed by a reactive sputtering using three pieces of Ta target.
Figure 33:
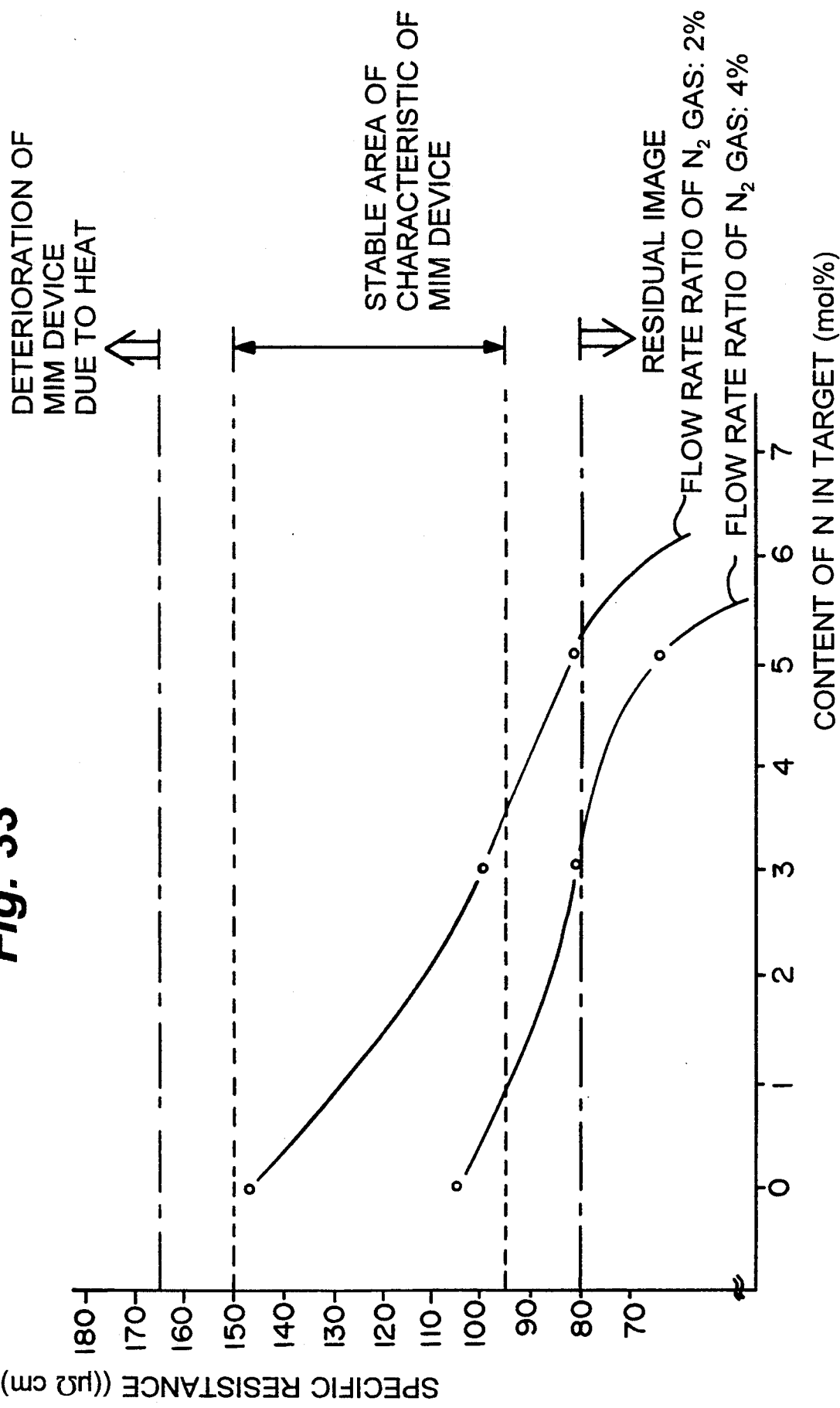
FIG. 33 is a diagram showing the relationship between the amount of nitrogen contained in sintered TaN and the specific resistance of a Ta film formed by a reactive sputtering using sintered TaN as a target.
Figure 34:
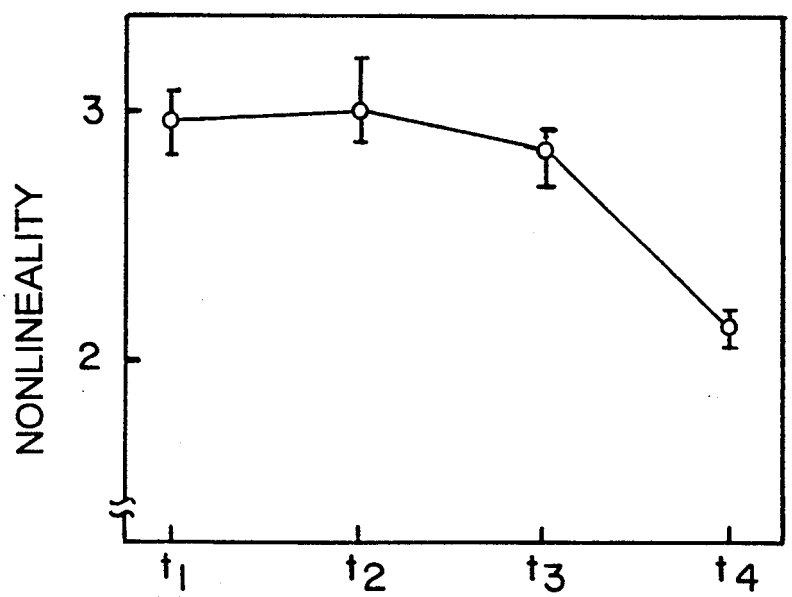
FIG. 34 is a diagram showing the nonlinearity of a conventional MIM device formed by using the β-Ta film, the nonlinearity being shown for each step.

FIG. 32 shows the relationship between the flow rate ratio of $N_2$ gas to (Ar+$N_2$) gas and the specific resistance of a thin Ta film obtained by the reactive sputtering using sintered TaN as a target in an atmosphere of (Ar+$N_2$) gas. The amount of nitrogen contained in sintered TaN is varied at 3 mol % and 5 mol %. FIG. 33 shows the relationship between the amount of nitrogen contained in sintered TaN and the specific resistance of the thin Ta film formed in the same way as in FIG. 32. In the case of FIG. 33, the flow rate ratio of $N_2$ gas to (Ar+$N_2$) gas is set at 2% and 4%. Further, FIGS. 32 and 33 also show the lighting evaluation of the liquid crystal display apparatus using the MIM devices obtained by using the Ta thin film.

As is understood from FIGS. 32 and 33, in the case of forming the thin Ta film by the reactive sputtering using sintered TaN in an atmosphere of (Ar+$N_2$) gas, it is preferred that the specific resistance of the thin Ta film is set in the range of 80 $\mu\Omega$cm to 165 $\mu\Omega$cm (sheet resistivity: 2.42 $\Omega/\square$ to 5.00 $\Omega/\square$) in order to prevent the deterioration of the nonlinearity of the MIM device and the occurrence of the residual image. Further, a more stable nonlinearity of the MIM device can be obtained by setting the specific resistance in the range of 95 $\mu\Omega$cm to 150 $\mu\Omega$cm (sheet resistivity: 2.88 $\Omega/\square$ to 4.55 $\Omega/\square$).

According to this example, when the specific resistance of the lower electrode constituting a two-terminal nonlinear device is set in the above-mentioned range, the occurrence of the residual image can be prevented in a liquid crystal display apparatus using the two-terminal nonlinear device. Further, the thermally deterioration of the nonlinearity of the two-terminal nonlinear device can be prevented.

Further, since a thin Ta film of this example is formed by any one of the reactive sputterings using three pieces of TaN target with a purity of 99.99% as in Example 1, the sputtering using sintered TaN target in Example 2 and the reactive sputtering using TaN target in an atmosphere of (Ar+$N_2$) Gas in Example 3, a uniform thin Ta film can be obtained as mentioned in Examples 1 to 3. Accordingly, the thickness of an insulator formed by the anodization of the thin Ta film is also uniform, whereby the unevenness in the nonlinearity among the two-terminal nonlinear devices is greatly decreased. Moreover, an excellent symmetrical curve of a current-voltage characteristic can be obtained by the anodization in 1 wt % of ammonium tartrate. In a liquid crystal display apparatus comprising the MIM devices, a display with high contrast and high quality can be obtained without any temperature dependency of the contrast ratio.

In addition, in the above-mentioned examples, krypton Gas is used for sputtering, in place of Ar gas. In this case, the same effects can be obtained.

As mentioned above, according to the present invention, a lower electrode of a two-terminal nonlinear device has a structure in which Ta poor portions (containing a small amount of nitrogen) and Ta rich portions (containing a large amount of nitrogen) are alternately deposited. The structure of the Ta poor portion is close to that of a thin $\beta$-Ta film and the structure of the Ta rich portion is close to that of a TaN film. Accordingly, an MIM device including an insulator obtained by the anodization of such a thin Ta film has the nonlinearity as excellent as that of a MIM device including an insulator obtained by the anodization of the $\beta$-Ta thin film. Further, nitrogen is taken in the Ta thin film, whereby the nonlinearity of the MIM device becomes thermally stable. Such a thin Ta film is obtained by a reactive sputtering using $N_2$ gas and a plurality of pieces of target (practically, 3 or 4 pieces of target) aligned in series.

Further, as mentioned in Example 2, when a thin Ta film is obtained by sputtering using sintered TaN containing nitrogen by amount in the range of 4 mol % to 7 mol %, the thin Ta film thus obtained has a structure in which the $\beta$-Ta films and $\alpha$-Ta thin films are coexistent. Accordingly, an MIM device including an insulator obtained by the anodization of the thin Ta film has an excellent and thermally stable nonlinearity. Further, since the thin Ta film contains nitrogen, the structure of the thin Ta film is uniform and fine. When the thin Ta film is formed with the resistance coefficient (lnA) in the range of −32 to −28, the sputtering rate becomes 1.3 to 1.9 times as high as the ordinary one. As a result, although the thin Ta film has a uniform and fine structure, the intervals in a Ta lattice are enlarged, whereby the current can easily flow.

When a thin Ta film is formed by the combination of the above-mentioned two sputtering methods using sintered TaN target and $N_2$ gas, a sufficient amount of nitrogen for obtaining an excellent and thermally stable nonlinearity can be taken into the thin Ta film, even though the amount of nitrogen contained in sintered TaN is reduced. Due to this, intervals in a Ta lattice in the structure of the thin Ta film can be enlarged, whereby the current can flow more easily. Further, since the flow rate ratio of $N_2$ gas can be decreased, it is possible that the flow rate of $N_2$ gas introduced into a chamber can be strictly regulated, thereby obtaining a uniform Ta thin film.

Moreover, when the specific resistance of the thin Ta film is set in the above-mentioned range, the deterioration of the nonlinearity of the MIM device and the occurrence of a residual image can be prevented.

Furthermore, a more symmetrical curve of a current-voltage characteristic can be obtained by the anodization in a solution containing the ammonium group.

In Examples 1, 3 and 4, three pieces of target are employed. It is appreciated that the number of pieces of target is not limited to three. As long as two or more pieces of target are employed, the same effects as in Example 1, 3 and 4 can be obtained.

Various other modification will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A two-terminal nonlinear device, comprising:
   a lower electrode of a thin Ta film doped with nitrogen which is formed on a substrate,
   an anodized oxide film formed by anodizing a surface of the lower electrode, and
   an upper electrode of a metal thin film which is formed on the anodized oxide film,
   wherein the thin Ta film includes a structure in which first portions and second portions are alternately deposited, the first portions containing a different amount of nitrogen from that contained in the second portions.

2. A two-terminal nonlinear device according to claim 1, wherein the first portions and the second portions are alternately deposited in a thickness direction of the thin Ta film.

3. A two-terminal nonlinear device according to claim 1, wherein the ratio of a peak value of a profile of the intensity of $^{14}N^+$ emission with regard to the intensity of $^{181}Ta^+$ emission in the first portions to that in the second portions is substantially in the range of 1:1.54 to 1:1.71.

4. A two-terminal nonlinear device according to claim 1, wherein the ratio of intensity of X-ray diffraction of (110) to the intensity of X-ray diffraction of (002) of the thin Ta film is substantially 1:0.248.

5. A two-terminal nonlinear device according to claim 1, wherein the thin Ta film is formed by a reactive sputtering using two or more pieces of Ta target with a purity of 99.99% in a mixed gas of argon gas and nitrogen gas; the ratio of a flow rate of the nitrogen gas to a flow rate of the mixed gas is substantially 3% to 7%; and the two or more pieces of Ta target are aligned in series in a direction where the substrate is conveyed.

6. A two-terminal nonlinear device according to claim 1, wherein a specific resistance of the thin Ta film is substantially in a range of 90 $\mu\Omega$cm to 165 $\mu\Omega$cm.

7. A two-terminal nonlinear device according to claim 6, wherein the specific resistance of the thin Ta film is substantially in a range of 105 $\mu\Omega$cm to 150 $\mu\Omega$cm.

8. A two-terminal nonlinear device according to claim 1, wherein the thin Ta film is formed by sputtering using two or more pieces of sintered TaN target in a mixed gas of argon gas and nitrogen gas; the ratio of a flow rate of the nitrogen gas to a flow rate of the mixed gas is substantially 4% or less; and the two or more pieces of sintered TaN target are aligned in series in a direction where the substrate is conveyed.

9. A two-terminal nonlinear device according to claim 8, wherein each of the two or more pieces of sintered TaN target contains nitrogen in amount of 5 mol % or less.

10. A two-terminal nonlinear device according to claim 8, wherein the thin Ta film is formed with a sputtering power of 4 W/cm$^2$ for a unit area of the sintered TaN target.

11. A two-terminal nonlinear device according to claim 8, wherein a specific resistance of the thin Ta film is substantially in a range of 80 $\mu\Omega$cm to 165 $\mu\Omega$cm.

12. A two-terminal nonlinear device according to claim 11, wherein the specific resistance of the thin Ta film is substantially in a range of 95 $\mu\Omega$cm to 150 $\mu\Omega$cm.

* * * * *

UNITED STATES PATENT AND TRADEMARK OFFICE
CERTIFICATE OF CORRECTION

PATENT NO. : 5,442,224
DATED : August 15, 1995
INVENTOR(S) : Yoshimizu et al

It is certified that error appears in the above-indentified patent and that said Letters Patent is hereby corrected as shown below:

In column 3, TABLE 1 should read as follows:

[Table 1]

| Flow Rate Ratio of $N_2$ gas to $(Ar+N_2)$ gas | MIM Device Characteristics (Nonlinearity) | Uniformity (Resistance) | Note |
|---|---|---|---|
| 2.2 x | ☆☆ | ☆☆☆☆☆ | |
| 2.9 x | ☆☆☆ | ※ ☆☆☆☆ | ※ Fig.7 |
| 3.1 x | ☆☆☆☆ | ☆☆☆☆ | |
| 3.6 x | ☆☆☆☆☆ | ☆☆☆☆ | |
| 4.3 x | ☆☆☆☆☆ | ※ ☆☆☆ | ※ Fig.7 |

$$\begin{bmatrix} ☆☆☆☆☆ & -- & \text{Very good} \\ ☆☆☆ & -- & \text{Good} \\ ☆☆ & -- & \text{Poor} \end{bmatrix}$$

Signed and Sealed this

Fifth Day of December, 1995

BRUCE LEHMAN

Attest:

Attesting Officer

Commissioner of Patents and Trademarks